United States Patent [19]

Rice et al.

[11] Patent Number: 5,065,147
[45] Date of Patent: Nov. 12, 1991

[54] METHOD AND APPARATUS FOR SIMULATING ANALOG DISPLAY IN DIGITAL DISPLAY TEST INSTRUMENT

[75] Inventors: Thomas A. Rice; David A. Smith; Alan W. Schmidt, all of Santa Rosa, Calif.

[73] Assignee: Hewlett-Packard Company, Palo Alto, Calif.

[21] Appl. No.: 353,369

[22] Filed: May 17, 1989

[51] Int. Cl.⁵ .............................................. G01R 13/22
[52] U.S. Cl. .................................... 340/744; 364/521; 340/728; 324/121 R; 324/77 B
[58] Field of Search ........................... 382/50; 364/521; 358/182; 340/720, 728, 736, 742, 744; 324/77 B, 77 C, 121 R

[56] References Cited

U.S. PATENT DOCUMENTS

| | | | |
|---|---|---|---|
| 4,251,755 | 2/1981 | Bryden | 340/742 |
| 4,486,785 | 12/1984 | Lasher | 340/728 |
| 4,752,826 | 6/1988 | Barnett | 340/720 |
| 4,809,189 | 2/1989 | Batson | 324/121 R |
| 4,837,561 | 6/1989 | Tucker | 324/121 R |
| 4,868,552 | 8/1989 | Chang | 324/121 R |
| 4,894,540 | 1/1990 | Komatsu | 340/728 |
| 4,940,931 | 7/1990 | Katayama | 324/121 R |
| 4,945,351 | 7/1990 | Naiman | 340/728 |
| 4,949,177 | 8/1990 | Bannister | 340/728 |
| 5,028,914 | 7/1991 | Povenmire | 324/121 R |

Primary Examiner—Kenneth A. Wieder
Assistant Examiner—Jose M. Solis
Attorney, Agent, or Firm—William C. Milks, III

[57] ABSTRACT

A method for simulating an analog display in a digital display spectrum analyzer (or other digital display test instrument) comprises the steps of defining a plurality, N, of traces of the signal to be displayed, assigning coordinate values to points along each trace, and plotting and simultaneously displaying each of the N traces by illuminating corresponding pixel locations on the CRT as indicated by the assigned coordinate values. The method permits effective simulation of trace persistence as commonly found in analog display test instruments. According to one embodiment of the invention, a color graphics controller/color CRT may be provided, in which case gray scales may be generated and displayed to simulate variations in intensity levels as commonly found in traces plotted on analog display test instruments. An apparatus for practicing the method is also disclosed.

17 Claims, 6 Drawing Sheets

$a = (0,0)$
$b = (1,0)$
$c = (0,1)$
$d = (1,1)$

METHOD AND APPARATUS FOR SIMULATING ANALOG DISPLAY IN DIGITAL DISPLAY TEST INSTRUMENT

FIELD OF THE INVENTION

This invention relates generally to electronic test instruments that display characteristics of AC signals. More particularly, this invention relates to a method and apparatus for simulating an analog display on a digital display spectrum analyzer.

BACKGROUND OF THE INVENTION

Digital display spectrum analyzers are well known in the art. One example of a digital display spectrum analyzer is the model 71000A modular spectrum analyzer manufactured by Hewlett-Packard Company ("HP"), Palo Alto, California. Analog display spectrum analyzers are also well known in the art. The model 8558 and 8559 spectrum analyzers manufactured by HP are exemplary.

Analog and digital display spectrum analyzers each have their own advantages and disadvantages, but digital display spectrum analyzers have gained greater popularity as a result of their greater bandwidth and flexibility as well as their display stability and consistency. Nonetheless, analog display spectrum analyzers have several desirable features which heretofore have not been realized in digital display spectrum analyzers due to inherent limitations of the latter.

For example, analog display spectrum analyzers exhibit a characteristic known as "overwriting" wherein the CRT beam can retrace part or all of a prior trace or traces to provide highly varying intensities along the X-Y axes. Both the relative intensity level of any portion of a trace, as well as the intensity variation along a trace, can be significant and may convey important information, for example, relative amount of Z-axis modulation of the displayed signal. Known digital display spectrum analyzers are generally incapable of displaying a waveform in this manner.

The problem is best exemplified by reference to FIGS. 1 and 2. FIG. 1 illustrates traces of a signal waveform plotted on a conventional analog display spectrum analyzer such as the HP model 8558 or 8559. (As used herein, the term "signal waveform" is not limited to a time vs. amplitude characterization of the signal, but as used in connection with spectrum analyzers also includes a frequency vs. amplitude characterization of the signal.) A peak 100, as well as subsidiary peaks 110 which may represent, for example, noise peaks or harmonics, are clearly visible. Noise 120 under the peaks is also clearly visible. Of particular interest, however, is the varying intensity of the peaks 100, 110 which would be clearly visible on an actual display of an analog display spectrum analyzer. (Actual intensity variations cannot be effectively illustrated herein due to limitations in reproducing an actual trace with solely black ink on a white medium.) Noise 120 along the X-Y axes is also of interest. As mentioned, the relative intensity level, as well as the intensity variations of both the peaks 100, 110 and the noise 120 may convey important information.

FIG. 2 illustrates a trace of the same signal waveform plotted on a conventional digital display spectrum analyzer such as the HP 71000A. As can be seen, not only are the subsidiary peaks 110' and noise not readily ascertainable, but in an actual display the intensity level of the trace would also be relatively constant. Thus, the information normally conveyed by relative intensity levels across the X-Y axes in an analog display spectrum analyzer is lost.

FIGS. 1 and 2 also illustrate another important advantage of analog display spectrum analyzers and corresponding disadvantage of digital display spectrum analyzers. Referring to FIG. 1, an underpeak 140, as well as "ripples" 160 along the base line of the signal waveform are clearly visible in the analog display. However, referring to FIG. 2, the corresponding underpeak 140', as well as the corresponding "ripples" 160' are not readily ascertainable from the digital display, and indeed might easily be overlooked without first having had the benefit of seeing the display of FIG. 1.

Still further, analog display spectrum analyzers provide trace "persistence" since trace data on the CRT is not immediately lost from trace to trace. Thus, multiple traces may be simultaneously plotted and displayed even though the input signal may have been digitally processed by the spectrum analyzer prior to display. Known conventional digital display analyzers generally do not plot multiple traces of a given input signal, and hence do not provide trace persistence.

The following examples illustrate the importance of the information that is "lost", or otherwise not readily ascertainable, in a conventional digital display spectrum analyzer. In a standard NTSC television signal, there is occasionally interference in the frequency area between the video carrier and the color carrier. If this interference is not frequency stable, or is weak, it may be difficult to detect on a conventional digital display spectrum analyzer due to the lack of intensity variation and persistence. Similarly, so-called "black-burst" television signals may exist when a first weak signal exists below a second stronger signal in the frequency spectrum. The first (weaker) signal exhibits an "underpeak" 140 readily ascertainable in an analog display spectrum analyzer (FIG. 1); however the underpeak is not readily ascertainable in a conventional digital display spectrum analyzer (FIG. 2). The so-called "Hannover Blind" effect often seen on a television screen (as the result of displaying a striped or checkered pattern) can be indicated by "ripples" readily ascertainable in an analog display spectrum analyzer. For example, "ripples" 160 (albeit not due to the Hannover Blind effect) are clearly ascertainable in FIG. 1, but not in FIG. 2.

Pulsed signals, such as those found in radar or FM applications, are not clearly ascertainable on a conventional digital display spectrum analyzer when one of the signals is stronger than another, due to the inability of a conventional digital display spectrum analyzer to plot the varying intensities of the trace of the signal waveform. Both signals would be readily visible and ascertainable on an analog display spectrum analyzer. Another example is the examination of television gray scales. It is possible to determine the amplitude of gray levels with an analog display spectrum analyzer because it is capable of displaying varying intensities, but not on a conventional digital display spectrum analyzer. Other examples where an analog display spectrum analyzer provides superior visual signal information include gated applications such as wideband local area networks, intermod distortion of television signals, differentiation of carrier feed-through power for radar signals, and situations in which it is necessary to differentiate between a plurality of signals that are superposed.

Notwithstanding the foregoing limitations, digital display spectrum analyzers offer important advantages over analog display spectrum analyzers, and further, digital display spectrum analyzers readily interface with other types of digital test equipment. It is therefore desirable to provide a digital display spectrum analyzer that retains all of the benefits of conventional digital display spectrum analyzers, but also provides the advantages of analog display spectrum analyzers discussed above. The present invention achieves this goal.

SUMMARY OF THE INVENTION

A method of simulating an analog display on a digital display spectrum analyzer (or other electronic test instrument having a digital display circuit including a CRT for displaying signal waveforms representing the characteristics of an AC signal) comprises the following steps: defining a plurality, N, of traces of the signal to be displayed; assigning coordinate values to points along each trace, each coordinate value corresponding to a pixel location of the CRT; and, plotting and simultaneously displaying each of the N traces by illuminating the pixel locations indicated by the assigned coordinate values. The plot is continuously updated by sequentially receiving traces of the signal and eliminating the oldest one of the N sequentially received traces when a subsequent trace of the signal is received. The subsequent trace is included as the newest one of the N traces, and the previous N-1 traces continue to be displayed while the display is updated with the newest one of the N traces.

According to one embodiment of the invention, the spectrum analyzer is operated in a "dots" mode wherein the illuminated pixel locations ("dots") are unconnected and the traces appear as a plurality of unconnected dots on the CRT. According to another embodiment of the invention, the spectrum analyzer is operated in a "lines" mode wherein the illuminated pixels ("dots") are connected and the traces appear as a plurality of lines on the CRT.

In either embodiment, a color graphics controller/color CRT may be substituted for the conventional monochrome graphics controller/monochrome CRT commonly found in digital display spectrum analyzers. In this embodiment, intensity variations may be displayed according to the following method: determining, for each coordinate value assigned, the number of traces having a corresponding coordinate value, the number of traces determined to have a corresponding coordinate value being a count of the number of times that the corresponding pixel location will be overlapped by the N traces; assigning a gray scale level to each coordinate value based upon the count determined in the immediately preceding step; and, illuminating the pixel locations at an intensity level determined by the gray scale levels assigned in the immediately preceding step.

An apparatus for practicing the method of the present invention is also disclosed. According to the invention, the apparatus comprises a spectrum analyzer (or other test instrument) equipped with a color graphics controller/color CRT and a digital display circuit, and means for (i) plotting and simultaneously displaying a plurality, N, of traces of a signal waveform to be displayed; (ii) determining and assigning gray level intensities to pixel locations of the CRT based upon the number of the N traces passing through each pixel location; and, (iii) illuminating each pixel location at its assigned gray level intensity. The apparatus thus permits different pixels of the CRT to be illuminated at different intensity levels to reflect a characteristic (such as Z-axis modulation) of the signal, and further permits trace persistence to be simulated as a consequence of simultaneously displaying a plurality of traces of the signal. Thus, the apparatus effectively permits simulation of an analog display in a digital display spectrum analyzer. In a preferred practice of the invention, the spectrum analyzer comprises a local oscillator module including a controller and ROM for controlling the digital display, and the aforementioned means comprises firmware stored in the ROM. The spectrum analyzer may comprise a Hewlett-Packard Company model 71000A digital display spectrum analyzer, and the local oscillator module may comprise a Hewlett-Packard Company model 70900A local oscillator module.

DETAILED DESCRIPTION OF THE INVENTION

The present invention will best be understood by first considering the manner in which a conventional digital display spectrum analyzer plots and displays a trace of a signal waveform. FIGS. 3A-3D are provided for this purpose.

Figure 3A:
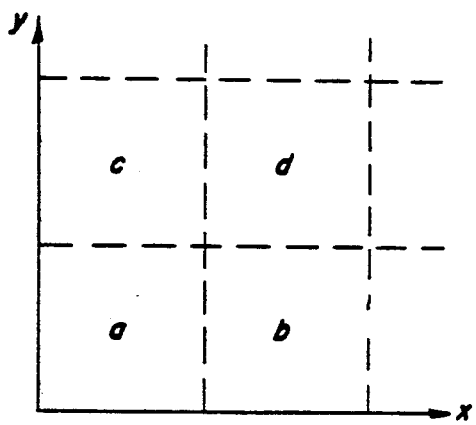
FIGS. 3A-3D conceptually illustrate the manner in which a trace is plotted and displayed in a prior art digital display spectrum analyzer.

The digital display portion of a digital display spectrum analyzer is a bit-mapped device wherein each element (bit) in an array corresponds to a pixel in the display. In the prior art, a selected number of data points, e.g., 800, is employed to construct a trace. The trace is displayed by illuminating the pixels corresponding to the data points ("dots") and also illuminating the pixels falling along lines that connect the "dots". For purposes of simplicity and explanation only, a hypothetical display may be considered as a 2×2 array as illustrated in FIG. 3A. Each element a-d represents a pixel along the X-Y axes of the display. The following X-Y coordinate values are assigned to each element of the array: a=(0,0); b=(1,0); c=(0,1); and d=(1,1). Each pixel represented by the elements a-d may assume one of two states, either on or off, signified respectively by "1" (on) or "0" (off). Before any traces are plotted on the display, each pixel a, b, c and d is off, and thus each element in the array has a "0" entered into a corresponding location, i.e., in a display buffer.

Consider three exemplary traces having the following coordinate values:
trace 1=(0,0), (1,1);
trace 2=(0,1), (1,1); and
trace 3=(0,0), (1,1).

Figure 3B:
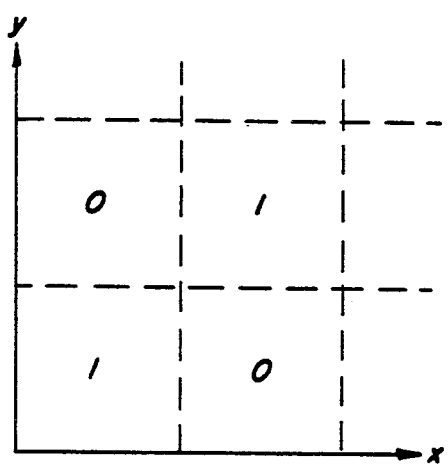
Figure 3C:
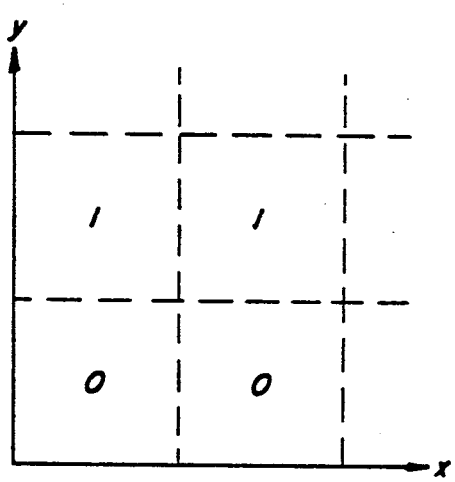
Figure 3D:
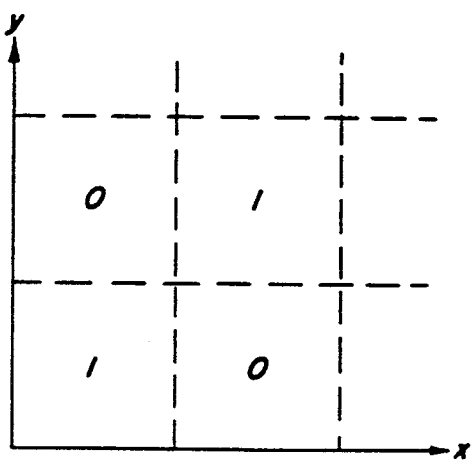

FIG. 3B illustrates trace 1. Thus, trace 1 is plotted by placing a "1" in the (0,0) pixel location and a "1" in the (1,1) pixel location. The c and b pixel locations remain at 0, signifying that these pixels remain off for this trace. In the prior art, pixels falling along the line that connects elements a and d would also be illuminated. FIGS. 3C and 3D illustrate traces 2 and 3 plotted in similar manner. FIGS. 3B-3D demonstrate a significant drawback of conventional digital display spectrum analyzers, i.e., the prior trace is erased each time a new trace is plotted and displayed. Thus, these figures demonstrate that trace 1 is lost when trace 2 is plotted and displayed, and trace 2 is lost when trace 3 is plotted and displayed, since only the last plotted trace can be displayed on the CRT at any time. The prior trace is erased in the prior art because overwriting a pixel with a series of "1"'s and/or "0"'s in a conventional digital display spectrum analyzer has no effect other than turning the pixel on and off. Since prior traces are erased, spurious signals and random noise, and also non periodic and unstable signals, are not displayed on the CRT with regularity. As mentioned, this occurs since conventional digital display spectrum analyzers do not provide multiple traces (i.e., persistence) as found in analog display spectrum analyzers.

According to the invention, the foregoing problem is overcome by providing a digital display spectrum analyzer with means for plotting and displaying multiple traces on a CRT. In one embodiment, the multiple traces are displayed in a "dots" mode wherein the pixels corresponding to the data points for each of the multiple traces ("dots") are illuminated, but intervening pixels falling along the lines connecting the "dots" of each trace are not illuminated. In other words, the "dots" are unconnected. In another embodiment, the multiple traces are displayed in a "lines" mode wherein the intervening pixels are illuminated. In other words, the "dots" are connected. In both modes, persistence is simulated, and the previously "lost" information is recovered. In either embodiment, a color graphics controller/color CRT may be provided (for operation of the digital display spectrum analyzer in either the "dots" or "lines" mode) so that gray scales, and hence intensity variations of the signal waveform, may be displayed. In a preferred embodiment of the invention, the "dots" or "lines" mode traces are generated on a conventional digital display spectrum analyzer (such as the HP 71000A modular spectrum analyzer equipped with a HP70900A local oscillator module) according to firmware hereinbelow described that may reside in a controller section of the local oscillator module. If display of intensity variations is desired, a color graphics controller/color CRT may be substituted for the conventional monochrome graphics controller/monochrome CRT so that generated gray scales can be displayed as hereinbelow described.

Figure 4:
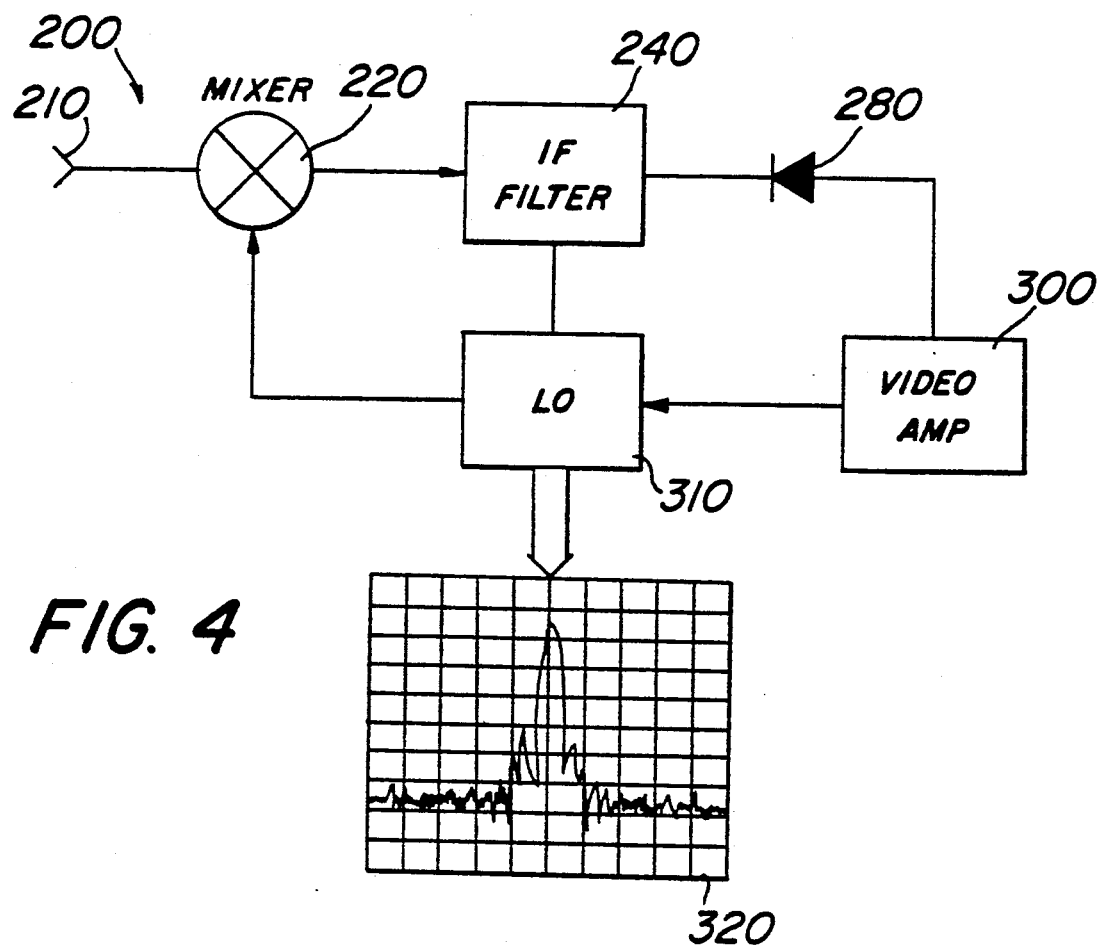
FIG. 4 is a block diagram of a spectrum analyzer according to the present invention.

Generally illustrated in FIG. 4 is a so-called "swept-tuned" digital display spectrum analyzer 200 according to the invention. The spectrum analyzer 200 may be a HP 71000A modular spectrum analyzer but is not limited thereto. As shown, a signal to be analyzed is input at 210 and provided to a mixer 220 which mixes the input signal with another signal from a local oscillator module 310. The local oscillator module 310 may be a HP 70900A local oscillator module as described and modified hereinbelow, but the invention is not limited to use of this particular local oscillator module. As is generally known in the art, when the mixer output signal frequency equals the intermediate frequency of an IF filter 240, the signal passes through to a peak detector 280. The output of the peak detector 280 is amplified by video amplifier 300 and then input to local oscillator module 310. The local oscillator module 310 processes the output of video amplifier 300 and feeds the processed output to a graphics controller/CRT 320 for display. Except as noted, the system and components thus far described are conventional and are present in commercially available digital display spectrum analyzers such as the HP 71000A modular spectrum analyzer. The exceptions are as follows. In one embodiment, the local oscillator module 310 is modified as described herein. In another embodiment, a color graphics controller/color CRT display is provided in substitution for the conventional monochrome graphics controller/monochrome CRT 320 generally provided therein, and the local oscillator module 310 is modified as described herein. In the latter embodiment, gray scales are generated, and intensity variations can be displayed.

Figure 5:
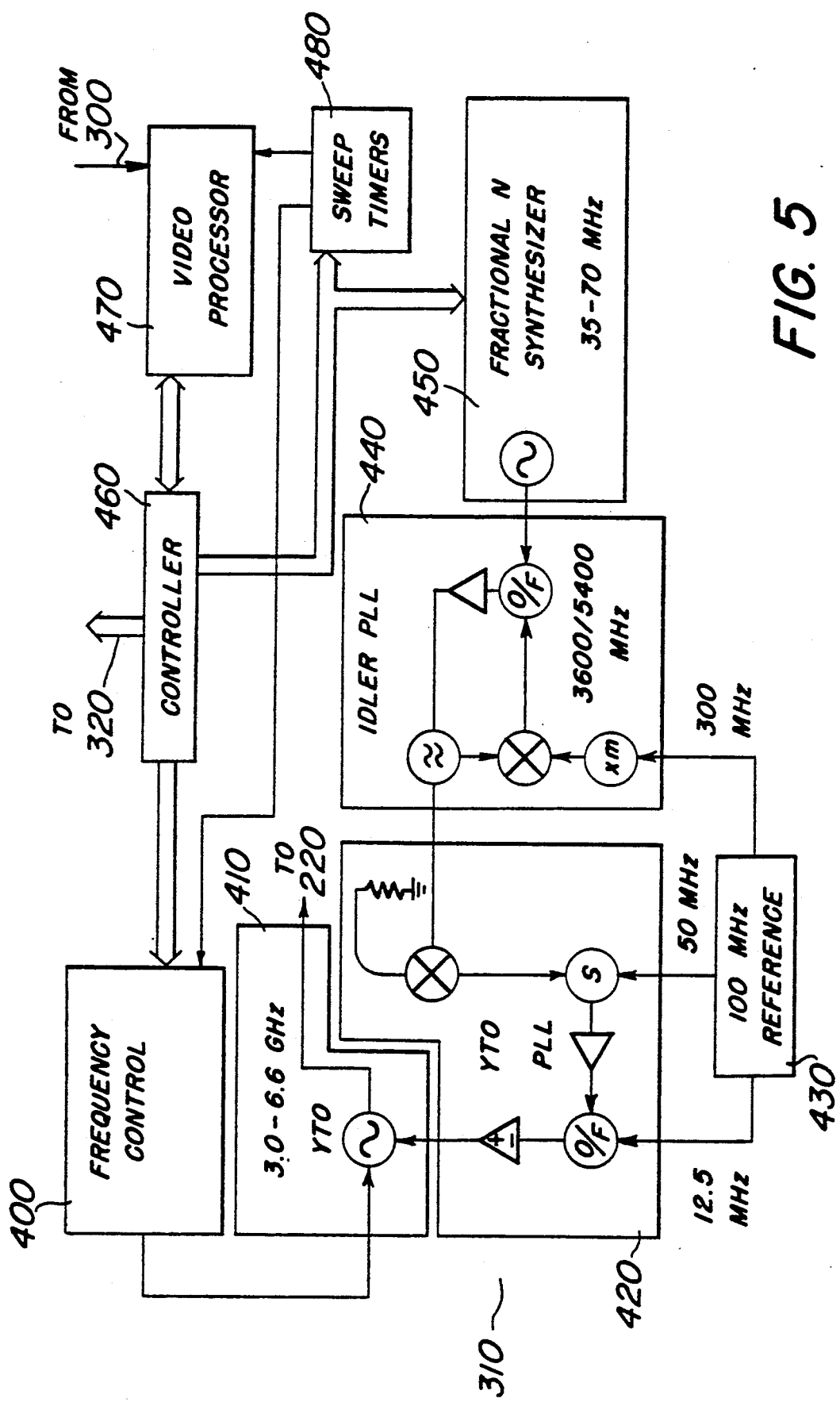
FIG. 5 is a block diagram of a local oscillator module for use in the spectrum analyzer of FIG. 4 according to the present invention.

FIG. 5 illustrates in block diagram form a HP 70900A firmware driven local oscillator module that may be employed as the module 310 when modified as described herein. As shown, module 310 comprises a controller 460, including a main processor and ROM. The ROM contains firmware that controls other modules that may be placed in the HP 71000A; the firmware also controls the front panel interface and the digital display of the spectrum analyzer. According to the invention, this firmware is modified as described hereinbelow. Module 310 also contains a video processor 470 which processes video (analog) data from the video amplifier 300. The video processor 470 bidirectionally communicates with controller 460. The module 310 further includes a YIG-tuned oscillator (YTO) 410 that is preferably swept from 3 to 6.6 GHz under control of a frequency control section 400. The frequency control section 400 is in turn responsive to commands from controller 460 and timing signals from sweep timers 480. A 300 MHz reference signal derived from a 100 MHz reference 430 is provided to an idler phase locked loop 440, and 12.5 MHz and 50 MHz reference signals similarly derived are provided to a YTO phase locked loop 420. A fractional-N frequency synthesizer 450 responsive to commands from the controller 460 controls the sweep of the YTO 410. The sweep timers 480 receive commands from the controller 460 and supply control signals to frequency control section 400 and video processor 470. The graphics controller/CRT 320 is responsive to commands from controller 460 to display waveforms thereon.

Firmware provided according to the present invention (for use in the controller 460 of the model 70900A local oscillator module 310) permits plotting of multiple traces to provide persistence on the display. If a color graphics controller/color CRT has been provided, the firmware may also plot traces or portions of traces in one of a plurality of gray scales on the color CRT display 320 so that they exhibit intensity variations.

Figure 7:
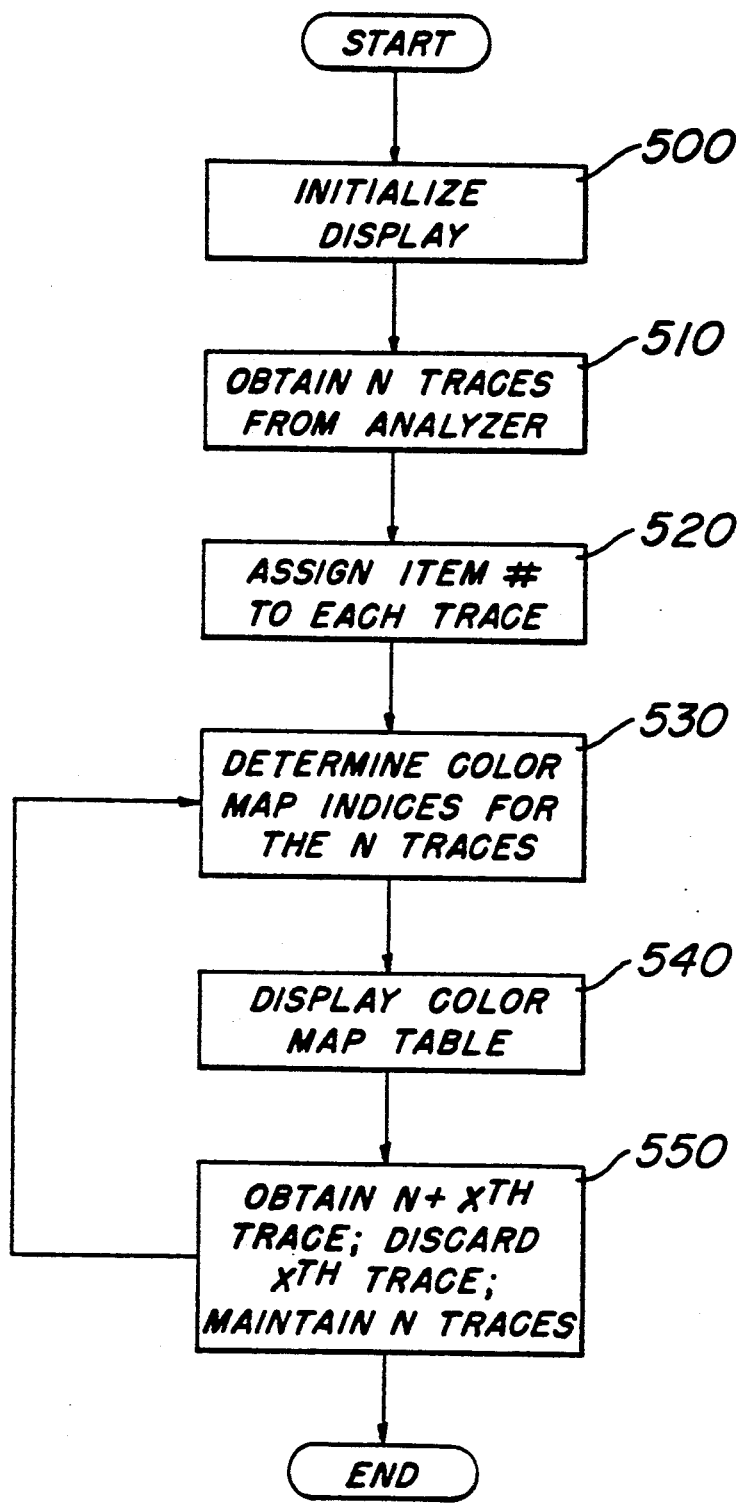
FIG. 7 is a flow chart illustrating the basic steps performed in accordance with the practice of the present invention.

FIG. 7 illustrates, in flowchart form, a preferred method of carrying out the instant invention. As illustrated at 500, the display of the spectrum analyzer is first initialized. Initialization clears the display of all prior traces. In the event that a color graphics controller/color CRT is provided (including well known color generating circuitry for assigning, by means of a color map table, gray scale levels to pixels of the CRT as described below), initialization also initializes the indices of the color map table to particular gray scales.

As illustrated at step 510, the number of traces, N, to be displayed is next obtained from the firmware. In the preferred embodiment, N equals 7. As illustrated at 520, an item number, 1 to N, is assigned to each trace for identification purposes. The first trace is assigned item number 1; the second trace is assigned item number 2; and so on with each subsequent trace being assigned the next number. Assignment of the item numbers "wraps around" after the Nth trace has been assigned item number N, so that when the next new trace (N+1) is received, the Nth trace receives item number 1 while the Nth plus 1 trace (i.e., the next new trace) receives item number 2, etc. Thus, it is only necessary to identify a trace by specifying its item number; its actual trace number in real time need not be considered.

As illustrated at 530, if a color graphics controller/color CRT has been provided, then the indices of the color map table for each of the points (i.e., pixels) of the N traces are next determined. This is performed in accordance with the principles hereinbelow described. Next, as illustrated at 540, if a color graphics controller/color CRT has been provided, then the display is placed in a graphics mode so that each of the N traces can be displayed according to the indices of the color map table.

According to the invention, the firmware can be placed in a "dots" mode wherein the points of traces plotted on the display (each corresponding to one of a plurality, e.g., 800, data points used to construct the trace) are not connected. In other words, the intervening pixels between the "dots" (i.e., those lying along lines connecting adjacent dots of a trace) are not illuminated. Alternatively, the firmware can be placed in a "lines" mode wherein the points of the traces plotted on the display are connected, i.e., the "dots" are connected by illuminating the pixels lying along lines connecting adjacent "dots" of each trace. These modes will become more apparent hereinafter. The decision as to which mode has been selected is made at block 540, though not illustrated therein.

Next, as illustrated at 550, the N+xth trace, where x is the oldest trace and N+x is the subsequently received (i.e., newest) trace, replaces the xth trace, i.e., the newest trace replaces the oldest trace. The display is then updated with the new information. The method can be analogized to a sliding window that is moved across the actual waveform to determine which portion thereof will be plotted next. In this fashion, the N most recent traces are always displayed, and if a color graphics controller/color CRT has been provided, this is performed after the indices into the color map table are updated as illustrated at 530. Steps 530-550 are repeatedly performed for the duration of the measurement. In general, any number of traces can be employed to obtain a simulated persistence plot of the signal. As mentioned, in the preferred embodiment, seven traces are employed to display the signal. Additionally, in the preferred embodiment, each of the seven traces comprises 800 data points.

Any commercially available color graphics controller/color CRT, equipped with suitable color generating circuitry, including a color map table for assigning gray levels to pixels of the CRT, may be employed in the practice of the present invention if display of intensity variations along the waveform is desired. The process of assigning and displaying gray levels is as follows. A number associated with a location corresponding to a point (i.e., a pixel) in a trace is an index into the color map table. The index indicates the number of traces that will pass through each coordinate pixel. Multiple traces can then be plotted on a digital display thereby simulating the persistence characteristics of an analog display spectrum analyzer.

Figure 6:
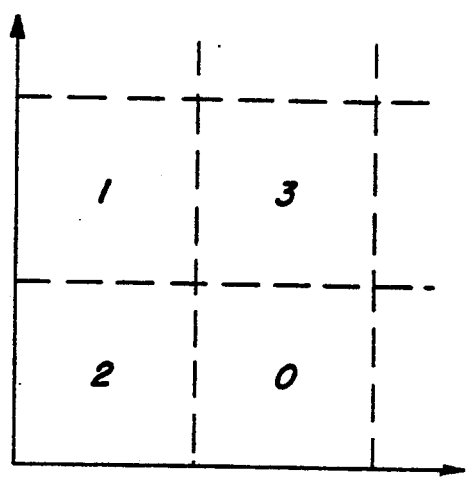
FIG. 6 conceptually illustrates a set of indices into a color map table as employed according to the practice of the present invention.

The concept is best illustrated by reference to FIG. 6. As shown in FIG. 6, a set of indices into a color map table has been constructed for the traces 1, 2 and 3 discussed previously. The color map indices provided therein are obtained by scanning the coordinates for each trace to be displayed to determine how many times each of the coordinate data points appears in all of the combined traces, i.e., to determine how many times the traces overlap or intersect at each pixel. Thus, for the three exemplary traces, a "1" appears in the coordinate position (0,0) two times so that the number "2" is placed in the (0,0) coordinate location in the color map table. Similarly, a "1" appears in the (0,1) coordinate position, once, while a "1" appears in the (1,1) coordinate position three times. Thus, the number "1" is placed in the (0,1) coordinate position, while the number "3" is placed in the (1,1) coordinate position. Since a "1" never appeared in the (1,0) coordinate position, a "0" is placed therein. In other words, no trace passed through coordinate position (1,0), and therefore this pixel should not be illuminated at all.

Each of the numbers entered into the color map table represents a gray level. For example, "0" represents "off", "1" represents a first, dim gray level, "2" represents a second, brighter gray level, "3" represents a third, yet brighter gray level, and so on. In the preferred practice of the invention, seven gray levels are provided, so that the numbers 0-7 are mapped into the color map table as above described. In this fashion, the number of traces that pass through each coordinate pixel location directly affects the intensity (i.e., gray level) of a plot at those locations when a color graphics controller/color CRT is provided. Thus, the greater the number of traces passing through a pixel, the greater the value of the corresponding color map index, and thus the brighter the display at that point. According to this embodiment of the invention, both persistence and intensity variations of a plot can thus be displayed on a digital display spectrum analyzer. The color map table can be used in digital display spectrum analyzers which employ raster scanning displays or in equipment which employs addressable X-Y plotting displays.

Figure 8:
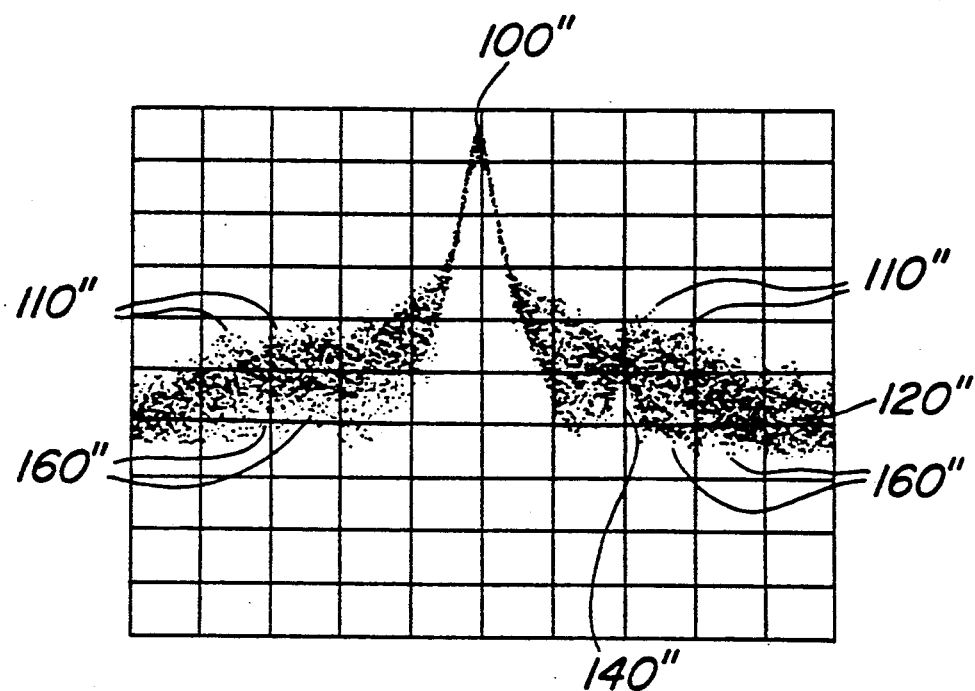
FIG. 8 illustrates a signal waveform as displayed on a digital display spectrum analyzer in accordance with one embodiment ("dots" mode) of the invention.

Referring to FIG. 8, a plot of a trace obtained according to practice of one embodiment of the present invention is illustrated. The trace is for the same signal waveform illustrated in FIGS. 1 and 2 and is illustrated as would appear on a conventional monochrome digital display. In a "dots" mode plot of this waveform on an actual color CRT in accordance with the invention, intensity variations in the plurality of plotted "dots" would be readily apparent. The trace of FIG. 8 is illustrated as plotted on a conventional HP 71000A spectrum analyzer, equipped with a HP 70900A local oscillator module modified as described above. The trace was obtained by plotting the seven traces simultaneously without connecting the plotted data points, i.e., the "dots" are unconnected. The peak of the signal is clearly visible at 100", while the subsidiary peaks are visible at 110". The underpeak 140" and the "ripples" 160" are also visible. Importantly, the noise 120", which was not plotted in the display of FIG. 2, is also clearly visible. Thus, much of the information previously lost in conventional digital display spectrum analyzers, including persistence, can now be displayed.

Figure 1:
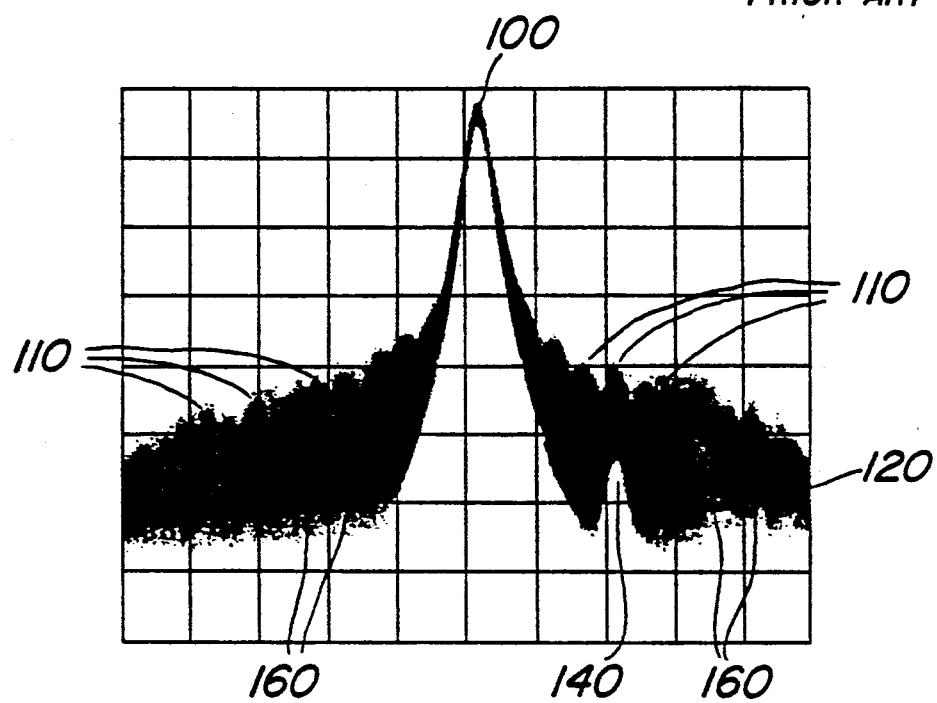
FIG. 1 is an illustration of a signal waveform displayed on a prior art analog display spectrum analyzer.
Figure 2:
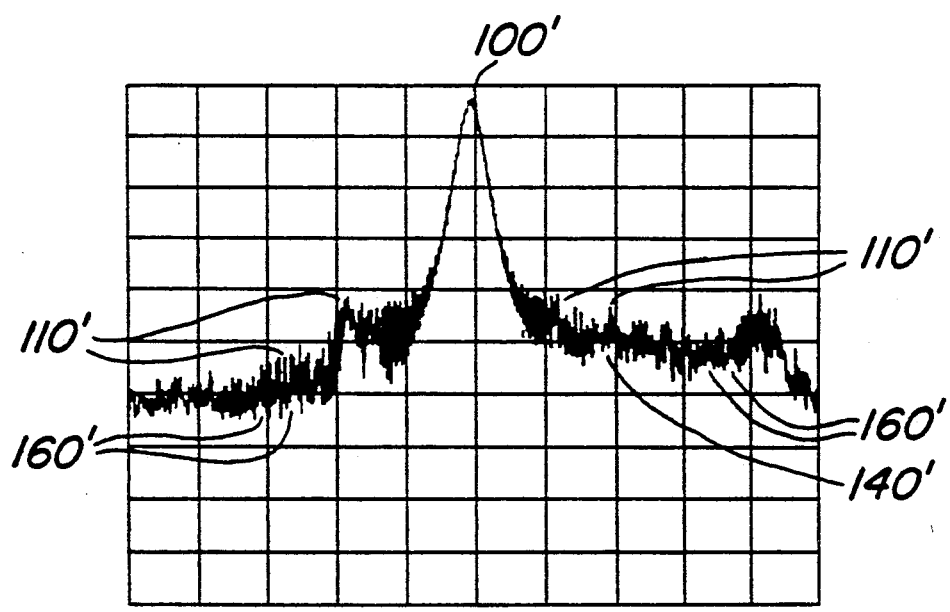
FIG. 2 is an illustration of the same waveform displayed on a prior art digital display spectrum analyzer.
Figure 9:
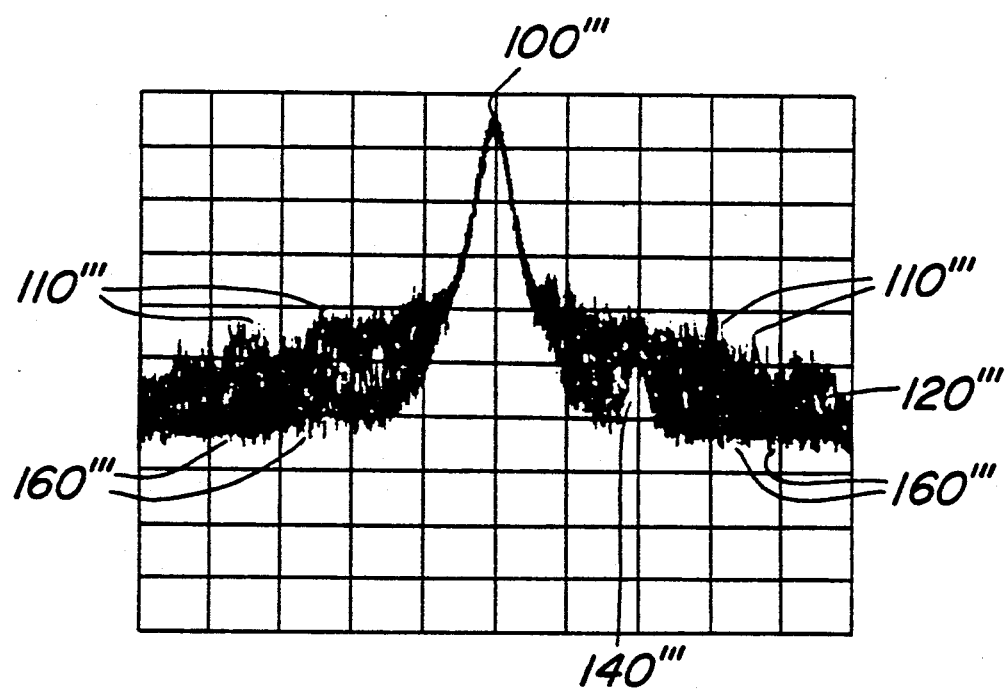
FIG. 9 illustrates the same signal waveform as displayed on a digital display spectrum analyzer in accordance with another embodiment ("lines" mode) of the invention.

Referring to FIG. 9, there is illustrated the same signal waveform as illustrated in FIGS. 1, 2 and 8, but the plot of FIG. 9 was generated in accordance with the "lines" mode embodiment of the invention, i.e., the "dots" are connected. This trace is illustrated as it would appear on a conventional monochrome digital display. In a "lines" mode plot of this waveform on an actual color CRT in accordance with the invention, intensity variations in the plurality of traces would be readily apparent. The trace of FIG. 9 is illustrated as plotted on a conventional HP 71000A digital display spectrum analyzer equipped with a HP 70900A local oscillator module modified as described above. Note that the plot of FIG. 9 closely resembles that of FIG. 1. Further note that the peak 100''' as well as the subsidiary peaks 110''' are clearly visible. More importantly, the underpeak 140''' and the ripples 160''' are also quite clearly visible. Noise 120', is also clearly visible, and the subsidiary peaks 110''', the underpeak 140''' and the ripples 160''' are easily distinguished from the noise 120'''.

The traces of FIGS. 8 and 9 were reproduced from actual photographs of the waveform as displayed on a HP 71000A digital display spectrum analyzer equipped with a color graphics controller/color CRT and a 70900A local oscillator module having firmware modified as described herein. Unfortunately, however, due to limitations in illustrating these traces solely with black ink on a white medium, the gray scales, and hence intensity variations, actually produced, cannot be effectively illustrated. Thus, FIGS. 8 and 9 more accurately depict the traces as they would appear on a monochrome CRT.

Appended hereto as Appendix A is a source code listing embodying the method of the present invention. This code is suitable for use with the aforementioned HP 71000A modular spectrum analyzer equipped with a HP 70900A local oscillator module. In the practice of the invention, the firmware in the ROM of the HP 70900A local oscillator module may be modified to include the software of Appendix A. In particular, the following line numbers of the appended code differ from the conventional code and thus relate to the present invention: page A1: lines 903–945; pages A2–A8: lines 47–52, 58–68, 122–400, 442–463, 481–509, and 647–648; page A 9: lines 949–951; page A10: lines 806–807, 816–818, and 829–836; pages A11–A16: lines 376–539, 832–836, and 1050–1058; page A17: lines 427–429; pages A18–A20, lines 355–373, 466–495, and 545–570. The conventional monochrome digital display of the HP 71000A modular spectrum analyzer may be substituted with a color digital display if gray scale displays as described herein are desired, or the standard monochrome digital display may be used to produce similar results, as illustrated in FIGS. 8 and 9.

The present invention may be embodied in other specific forms without departing from the spirit or essential attributes thereof and, accordingly, reference should be made to the appended claims rather than to the foregoing specification as indicating the scope of the invention.

```
Apr 25 17:28 1989 exec_tr2.P Page 19

901  END ;
902
903  $ GLOBPROC ON $
904  (:----------------------------------------
905  (   persitence mode control
906
907  PROCEDURE exe_persist( VAR source : command_source_type ;
908                        function : execrtn_function ;
909                        VAR value : longreal ;
910                        VAR ovalue : boolean ) ;
911
912  FUNCTION persist_lock_open (next: INTEGER): BOOLEAN; EXTERNAL;
913
914  BEGIN
915   WITH state DO BEGIN
916    IF function = func_set THEN BEGIN
917     want_num_persist_traces := ROUND(value) ;
918     limit_persist_traces(want_num_persist_traces);
919     want_persist := persist_lock_open(want_num_persist_traces); ( T
920     (* want_persist := TRUE; *)
921    END ;
922
923    IF function = func_onoff THEN
924     want_persist := (ovalue AND persist_lock_open(0)); ( TEMPI )
925     (* want_persist := ovalue; *)
926
927    value:= longreal(want_num_persist_traces);
928    ovalue:= want_persist;
929   END;
930  END ;
931
932  $ GLOBPROC ON $
933  (:----------------------------------------
934  (   show a trace as lines or dots
935
936  PROCEDURE exe_lines( VAR source : command_source_type :
937                      function : execrtn_function ;
938                      VAR value : boolean ) ;
939  BEGIN
940   IF function = func_onoff THEN
941   BEGIN
942    state.want_dots := NOT value;
943   END;
944    value:= NOT state.want_dots;
945  END;
946
947  $GLOBPROC ON $
948  (*********************************************
949  PROCEDURE process_user_trace( VAR source : command_source_type ;
950
```

```
Apr 27 09:37 1989  disp_trac.P Page 1

1    "68000" PREPROCESS                compile
  2    $ASM_FILE ON$
  3    $WARN OFF$
  4    $VOLATILE ON$
  5    $WARN ON$
  6
  7    ( @(#)disp_trac.P       8.17 )
  8
  9    $ BASE PAGE$
 10    PROGRAM DISPLAY_TRACE ;
 11
 12    $EXTENSIONS ON$
 13    $ OPTIMIZE ON $
 14    $ WARN OFF $
 15
 16
 17
 18    # INCLUDE /users/msa/pub/g_system.h
 19    # INCLUDE /users/msa/pub/g_bits.h
 20    # INCLUDE /users/msa/pub/g_opsys.h
 21    # INCLUDE /users/msa/pub/g_cn_misc.h
 22    # INCLUDE /users/msa/pub/g_startup.h
 23    # INCLUDE /users/msa/pub/g_display.h
 24    # INCLUDE /users/msa/pub/g_command.h
 25    # INCLUDE /users/msa/pub/g_state.h
 26    # INCLUDE /users/msa/pub/g_trace.h
 27    # INCLUDE /users/msa/pub/g_tcond.h
 28    # INCLUDE /users/msa/pub/g_io_path.h
 29    # INCLUDE /users/msa/pub/g_io1.h
 30    # INCLUDE /users/msa/pub/g_md.h
 31    # INCLUDE /users/msa/pub/g_dconst.h
 32
 33    ($FAR   $)
 34
 35    CONST
 36      GEM_CAN_HOLDOFF = 1;
 37
 38    TYPE
 39      string15 = PACKED ARRAY[0..15] OF char ;
 40      string19 = PACKED ARRAY[0..19] OF char ;
 41      string39 = PACKED ARRAY[0..39] OF char ;
 42      string50 = PACKED ARRAY[0..50] OF char ;
 43
 44    $ BASE_PAGE$
 45    VAR
 46      cur_disp_trace : integer ;  ( trace currently being displayed )
 47      persist_curr_trace      : SIGNED_8;
 48      dsts_last_cmd           : string50;       ( display_set_trace_star
 49      dsts_trace              : signed_16;
```

```
Apr 27 09:37 1989  disp_trac.P Page 2

51      dsts_persist_on         : boolean;
 52      dsts_trace_as_dots      : boolean;         ( seven variables )
 53    $ GLOBVAR ON$
 54      trace_resource : resource ;
 55      hide_next_trace: boolean;
 56      TRBPTR: UNSIGNED_32;
 57      TRBPATH: integer;
 58      num_persist_traces      : SIGNED_8;         ( number of traces )
 59      persist_trace_shown     : ARRAY [0..MAX_PERSIST_TRACES-1] OF boo
 60      persist_on              : boolean;          ( persistence on or off
 61      trace_as_dots           : boolean;          ( traces as lines or dot
 62
 63      persist_digit           : INTEGER;          ( TEMP( for combo lock )
 64      min_bright              : integer;          ( min persist trace brig
 65                                                  ( this is a variable to
 66                                                  ( testing easier; it is
 67                                                  ( intended for user use
 68      color_disp              : boolean;          ( is this display color?
 69    $ EXTVAR ON$
 70    VAR
 71      trace_has_display : boolean ;
 72      trace_mode       : boolean ;
 73      gem              : resource;
 74      current_item     : integer ;
 75      item_resource    : resource ;
 76      pan_pen_up       : boolean;           ( have we panned & put the gem pen up? )
 77      status_path      : integer;
 78      updates_todo     : updates_set;
 79      update_count     : integer;
 80      kbd_path_ready   : boolean;
 81      active_trace     : integer;
 82    $ EXTVAR OFF$
 83
 84    $ LIB_ABS_SHORT $
 85    $ CALL_ABS_SHORT $
 86
 87    # INCLUDE /users/msa/pub/p_os_reso.h
 88    # INCLUDE /users/msa/pub/p_util.h
 89
 90    $ CALL_ABS_LONG $
 91
 92    # INCLUDE /users/msa/pub/p_string.h
 93    # INCLUDE /users/msa/pub/p_g_state.h
 94    # INCLUDE /users/msa/pub/p_bw_exec.h
 95    # INCLUDE /users/msa/pub/p_trace1.h
 96    # INCLUDE /users/msa/pub/p_markers.h
 97    # INCLUDE /users/msa/pub/p_io_2.h
 98    # INCLUDE /users/msa/pub/p_dto.h
 99    # INCLUDE /users/msa/pub/p_dacq.h
100    # INCLUDE /users/msa/pub/p_dedg.h
```

Apr 27 09:37 1989 disp_trac.P Page 3

```
101  # INCLUDE /users/msa/pub/p_dpth.h
102  # INCLUDE /users/msa/pub/p_dscl.h
103
104  PROCEDURE group_item_string (group, item : integer; VAR str: string );  E
105  FUNCTION get_trace_addr( num : signed_16 ) : trace_addr ;     EXTERNAL ;
106  FUNCTION get_trace_cond( num : signed_16 ) : trace_cond_addr ; EXTERNAL
107  PROCEDURE send_trace( trace : trace_addr ;
108                        size : integer )                         EXTERNAL ;
109  PROCEDURE usend_trace( trace : trace_addr ;
110                         size , start, min : integer ) ; EXTERNAL ;
111  PROCEDURE set_new_start_bucket ;                               EXTERNAL ;
112  FUNCTION get_trace_states_type : ptr_trace_states_type ;       EXTERNAL ;
113  PROCEDURE user_item_string ( VAR temp_str : STRING );          EXTERNAL ;
114  FUNCTION trace_disp_ready : boolean ;                          EXTERNAL ;
115  PROCEDURE update_dscale_nocalc ;                               EXTERNAL ;
116  FUNCTION need_curr_val (e: display_enmun);                     EXTERNAL ;
117  PROCEDURE select_pen(which_pen: pen_types; two_digits: boolean);
118                       VAR str: string);                                  EXTERNAL
119  PROCEDURE re_do_window;                                                 EXTERNAL
120
121  $CALL_PC_SHORTS
122  $ GLOBPROC OFF $
123  (******************************************************************)
124  (                                                                  )
125        Convert integer trace number to character
126  (                                                                  )
127  FUNCTION trace_char( trace : signed_16 ) : char ;
128
129  BEGIN
130     trace_char := CHR( trace + ORD( '1' )) ;
131     END ;
132
133  $ GLOBPROC OFF $
134  (******************************************************************)
135  (       Restore the saved color map                                )
136
137  PROCEDURE restore_color_map;
138  VAR
139      i       : byte;
140      cmd     : string15;
141  BEGIN
142      cmd := 'PC -1;';
143
144      out_disp_string(display_path, cmd);          ( restore normal
145                                                     map )
146  END;                                             ( change pen col
147  $ GLOBPROC ON $
148  (******************************************************************)
149  (      Erase a persistence trace from the display                  )
150
```

Apr 27 09:37 1989 disp_trac.P Page 4

```
151  PROCEDURE erase_persist_trace(which: SIGNED_8; VAR str : string);
152  BEGIN
153      group_item_string (persist_group, which + PERSIST_ITEM_OFFSET, str )
154      concat_str (str, 'DL;') ;                    ( delete an item )
155      persist_trace_shown[which] := FALSE;    ( trace not shown after this is
156  END;
157
158  $ GLOBPROC ON $
159  (******************************************************************)
160  (      Erase all persistence traces from the display               )
161
162  PROCEDURE erase_all_persist(use_out_disp: boolean);
163  VAR
164      cmd : string19 ;
165      i   : byte;
166      any : boolean;
167  BEGIN
168      any := persist_trace_shown[0] ;               ( first element )
169      FOR i := 1 TO MAX_PERSIST_TRACES-1 DO         ( remaining elements )
170         any := (any) OR (persist_trace_shown[i]); ( any to erase? )
171      IF (any)                                      ( something to erase )
172      THEN BEGIN
173         cmd := 'HF1;';                             ( hold off screen updati
174         IF use_out_disp                            ( output methodology )
175         THEN out_disp_string(display_path, cmd)
176         ELSE display_string(cmd);
177         FOR i := 0 TO MAX_PERSIST_TRACES-1        ( clean up old traces )
178         DO BEGIN
179            IF (persist_trace_shown[i])             ( needs to be erased )
180            THEN BEGIN
181               erase_persist_trace(i, cmd);         ( erase a trace )
182               IF use_out_disp
183               THEN out_disp_string(display_path, cmd)
184               ELSE display_string(cmd);
185            END;
186         END;
187         cmd := 'HF0;';                             ( of FOR )
188         IF use_out_disp                            ( realtow screen updatin
189         THEN out_disp_string(display_path, cmd)
190         ELSE display_string(cmd);
191      END
192  END;
193
194  $ GLOBPROC ON $
195  (******************************************************************)
196  (      Initialize the persistence display parameters               )
197
198  PROCEDURE init_persist(powerup: boolean);
199  VAR
200
```

```
Apr 27 09:37 1989  disp_trac.P Page 5

201        i      : BYTE;
202  BEGIN
203        persist_on := FALSE;                      ( persistence currently
204        trace_as_dots := FALSE;                   ( traces currently as li
205        num_persist_traces := 0;                  ( no persistence traces
206        acquire_display;
207        restore_color_map;
208        IF (powerup)                              ( default colors )
209        THEN BEGIN                                ( initialize the array )
210          FOR i := 0 TO MAX_PERSIST_TRACES-1 DO
211            persist_trace_shown[i] := FALSE;
212        END
213        ELSE BEGIN                                ( no persist traces show
214          erase_all_persist(TRUE);
215        END;
216        release_display;                          ( IP or RCLS )
217        persist_curr_trace := 0;                  ( starting array index )
218        persist_digit := 0;                       ( TEMP: combination lock
219        dsts_trace := -1;                         ( display_set_trace star
220        dsts_persist_on := FALSE;                 ( no saved command )
221        dsts_trace_as_dots := FALSE;
222        dsts_last_cmd := '';
223        min_bright := 6*16;                       ( min persist trace brig
224  END;
225
226
227  $ GLOBPROC ON $
228  (*****************************************************************)
229  (   Range limit the number of persistence traces                  )
230  (*****************************************************************)
231  PROCEDURE limit_persist_traces(VAR traces: SIGNED_8);
232  BEGIN
233        IF (traces < 1)                           ( 1 <= traces <= MAX_PERSIST_TRA
234        THEN traces := 1
235        ELSE IF (traces > MAX_PERSIST_TRACES)
236          THEN traces := MAX_PERSIST_TRACES;
237  END;
238
239
240  $ GLOBPROC OFF $
241  (*****************************************************************)
242  (   Compute line style from display option                        )
243  (*****************************************************************)
244  FUNCTION trace_style( trace : signed_16; dots : boolean ) : char ;
245  BEGIN
246        IF ((trace = 0) AND (dots))
247        THEN trace_style := '0'                   ( endpoints only )
248        ELSE trace_style := ' ';                  ( default style: solid line )
249  END;
250
```

```
Apr 27 09:37 1989  disp_trac.P Page 6

251
252  $ GLOBPROC ON $
253  (*****************************************************************)
254  (   Bump the index of the next persistence display trace          )
255  (*****************************************************************)
256  PROCEDURE bump_persist_trace;
257  VAR
258        cmd : string19 ;
259  BEGIN
260        persist_curr_trace := (persist_curr_trace + 1) MOD num_persist_traces
261  END;
262
263
264  $ GLOBPROC OFF $
265  (*****************************************************************)
266  (   Adjust the color map based on the number of persistence traces)
267  (*****************************************************************)
268  PROCEDURE persist_color_map(traces: SIGNED_8);
269  CONST
270        MAX_BRIGHT = 255;                         ( byte valued )
271  VAR
272        i           : byte;
273        green       : integer;
274        cmd         : string19;
275        bright_range: integer;
276        denom, mult : longreal;
277  BEGIN
278        bright_range := MAX_BRIGHT - min_bright;
279        denom := log2(traces);                    ( range to scale
280        FOR i := 1 TO traces                      ( denominator of
281        DO BEGIN                                  ( set the pen co
282          IF (i = traces)
283          THEN BEGIN                              ( all traces: ma
284            green := MAX_BRIGHT;
285          END
286          ELSE IF (i = 1)
287          THEN BEGIN                              ( one trace: min
288            green := min_bright;
289          END
290          ELSE BEGIN                              ( not one or all
291            mult := SQRT(log2(i) / denom);        ( logrithmic sca
292            green := integer(mult) * bright_range + min_bright;
293          END;
294          cmd := "PC ";                           ( pen color )
295          integer_string (i, 2, ADDR(cmd));       ( pen  mber )
296          concat_str(cmd, ',0,');                 ( rev intensity
297          integer_string (green, 3, ADDR(cmd));   ( green intensit
298          concat_str(cmd, ',0;');                 ( blue intensity
299          out_disp_string(display_path, cmd);     ( change pen col
300                                                  ( e.g., PC 1,0,2
```

```
Apr 27 09:37 1989  disp_trac.P Page 7

301        END;
302     FOR i := traces+1 TO 15                                          ( beyond the tra
303     DO_BEGIN
304        green := MAX_BRIGHT;
305        cmd := "PC ";                                                 ( full on )
306        integer_string (i, 2, ADDR(cmd));                             ( pen color )
307        concat_str(cmd, ',0,');                                       ( pen number )
308        integer_string (MAX_BRIGHT, 3, ADDR(cmd));                    ( red intensity
309        concat_str(cmd, ',0;');                                       ( green intensit
310        out_disp_string(display_path, cmd);                           ( blue intensity
311        END;                                                          ( change pen col
312     END;
313  $ GLOBPROC OFF $
314  (*********************************************************************
315  (    Check and switch between various display modes.                 )
316  (*********************************************************************
317  
318  PROCEDURE switch_disp_mode(trace: signed_16);
319  VAR
320    {                        : byte;
321    last_persist, last_dots  : boolean;
322    last_num_persist         : SIGNED_8;
323    cmd                      : string39;
324  BEGIN
325     IF (trace = 0) THEN BEGIN                                         ( could be persi
326        last_persist := persist_on;                                    ( what modes wer
327        last_dots := trace_as_dots;
328        persist_on := state.want_persist;                              ( desired displa
329        trace_as_dots := state.want_dots;
330        IF ( (last_dots <> trace_as_dots) OR                           ( switching the
331             (last_persist <> persist_on) )
332        THEN_BEGIN
333           IF ( (trace_mode) AND (cur_disp_trace = trace) )            ( restart trace
334           THEN BEGIN
335              display_end ;
336              trace_mode := false ;
:36           END;
337        erase_all_persist(TRUE);                                       ( clean up old t
338        num_persist_traces := 0;                                       ( no persist tra
339        IF (persist_on AND (NOT last_persist) )                        ( entering persi
340        THEN BEGIN                                                     ( erase old trac
341           group_item_string (trace_group, trace + 1, cmd ) ;
342           concat_str (cmd, 'DL;') ;                                   ( delete an item
343           out_disp_string( display_path, cmd ) ;
344        END
345        ELSE IF (last_persist AND (NOT persist_on) )                   ( leaving persis
346        THEN BEGIN
347           IF (color_disp) THEN restore_color_map;                     ( normal colors
348        END;
349        IF (persist_on)                                                ( switching to p
350

Apr 27 09:37 1989  disp_trac.P Page 8

351        THEN BEGIN
352           num_persist_traces := state.want_num_persist_traces;
353           limit_persist_traces(num_persist_traces);                   ( range enforcem
354           persist_curr_trace := 0;                                    ( next one to us
355           IF (color_disp)                                             ( set up the col
356              THEN persist_color_map(num_persist_traces);
357        END;                                                           ( of switch to p
358        IF (last_persist <> persist_on)                                ( need to redraw
359                                                                       screen to acco
360                                                                       pen number cha
361     END;
362     THEN BEGIN
363        ( release the resources that the window redraw needs )
364        release_display;                                               ( acq just befor
365                                                                       procedure was
366                                                                       from display_s
367        release_resource(trace_resource);                              ( acq'ed just be
368                                                                       disp_set... ca
369        re_do_window;                                                  ( redraw the scr
370        ( reacquire the released resources )
371        acquire_resource(trace_resource);
372        acquire_display ;
373     END;
374     IF (persist_on AND (num_persist_traces <> state.want_num_persist_t ( of switching m
375                                                                       ( different coun
376     THEN_BEGIN
377        last_num_persist := num_persist_traces;                        ( save old count
378        num_persist_traces := state.want_num_persist_traces;
379        limit_persist_traces(num_persist_traces);                      ( range enforcem
380        IF (last_num_persist > num_persist_traces)                     ( reducing # of
381     THEN BEGIN
382        FOR i := num_persist_traces TO last_num_persist-1
383        DO BEGIN
384           IF (persist_trace_shown[i])                                 ( clean up old t
385           THEN BEGIN
386              erase_persist_trace(i, cmd);                              ( erase a trace
387              out_disp_string(display_path, cmd);
388           END;                                                         ( of if )
389        END;                                                            ( of for )
390        IF (persist_curr_trace >= num_persist_traces)                   ( next trace to
391           THEN persist_curr_trace := 0;                                ( of if last_per
392     END;                                                               ( set up the col
393     ( ELSE: increasing traces - will work automatically! )
394     IF (color_disp)
395        THEN persist_color_map(num_persist_traces);
396     END;                                                               ( of if persist
397  END;                                                                  ( of trace = 0 )
398  END;
399  
400  $ GLOBPROC ON $
```

```
401   (*********************************************************)
402   (    Release display from use by trace                    )
403   (*********************************************************)
404   PROCEDURE release_trace_display ;
405
406   BEGIN
407      IF trace_has_display THEN BEGIN
408         release_polled_output( display_path ) ;
409         release_resource( gem ) ;
410         trace_has_display := false ;
411         END ;
412      END;
413
414
415   $ GLOBPROC ON $
416   (*********************************************************)
417   (    Acquire display for use by trace   )
418   (*********************************************************)
419   PROCEDURE acquire_trace_display( trace : signed_16 ) ;
420
421   VAR
422      t : byte;
423      cmd : string39 ;
424      have_polled_out : boolean ;
425
426   BEGIN
427
428      IF trace_disp_ready THEN BEGIN                               $ OPTIMIZE OFF $
429         acquire_resource( gem );                                  $ OPTIMIZE ON  $
430
431         IF trace_disp_ready THEN BEGIN                            $ OPTIMIZE OFF $
432            switch disp mode(trace);                               $ OPTIMIZE ON  $
433            cmd := '' ;
434            IF ( trace_mode ) AND
435               ( cur_disp_trace <> trace ) THEN BEGIN
436               display_end ;
437               trace_mode := false ;
438               END ;
439
440            IF (NOT trace_mode) THEN_ BEGIN     ( need to enter trace mo
441            IF ( (trace = 0) AND (persist_on) ) ( persistence trace )
442            THEN_ BEGIN
443               persist_trace_shown[persist_curr_trace] := TRUE;
444                                                  ( about to be shown )
445               group_item_string (persist_group,
446                                  persist_curr_trace + PERSIST_ITEM_OFFS
447                                  cmd);
448
449               END                              ( normal trace )
450            ELSE BEGIN
```

```
451                  group_item_string (trace_group, trace + 1, cmd );
452                  END;
453               concat_str (cmd, 'GA#!' );         ( ready for binary data
454               out_disp_string( display_path, cmd );
455               trace_mode := true;
456               cur_disp_trace := trace;
457               END;
458            have_polled_out := acquire_polled_output( display_path ) ;
459            IF have_polled_out THEN
460               trace_has_display := true ;
461            END ;
462         IF trace_has_display = false THEN
463            release_resource( gem ) ;
464         END ;
465      END;
466
467
468   $ GLOBPROC ON $
469   (*********************************************************)
470   (    Set start point in trace
471   (*********************************************************)
472   PROCEDURE display_set_trace_start( trace, start : signed_16 ) ;
473
474   VAR
475      cmd : string50 ;
476      s : string19 ;
477
478   BEGIN
479      acquire display ;
480      cmd := '' ;
481      switch disp mode(trace);                 ( trace mode can switch now )
482      IF ( (dsts_trace = trace) AND            ( same as the last time thru? )
483         (dsts_persist_on = persist_on) AND
484         (dsts_trace_as_dots = trace_as_dots) )
485
486      THEN BEGIN                               ( note: color disp isn't checked
487         cmd := dsts_last_cmd;                 ( the same: don't reform the com
488         END
489      ELSE_ BEGIN                              ( for the command )
490         IF ((trace = 0) AND (persist_on))     ( trace A: could be persist )
491         THEN group_item_string (persist_group,
492                                 persist_curr_trace + PERSIST_ITEM_OFFSE
493            ELSE group_item_string (trace_group, trace + 1, cmd);
494         select_pen(pen_types(trace),FALSE,cmd);
495                                               ( 0: trace_a_pen ... 2:trace_c_p
496         concat_str (cmd, 'LT');               ( line type: solid or dots )
497         append_char (cmd, trace_style (trace, trace_as_dots));
498         IF (persist_on)                       ( persistence mode? )
499            THEN IF ( (trace = 0) AND (color_disp)
500                                               ( proper trace, display supports
```

Apr 27 09:37 1989 disp_trac.P Page 11

```
501              THEN concat_str(cmd, ';DM17,0,0');
502         concat_str (cmd, ';DX1' );           ( color map addition drawing mod
503         dsts_last_cmd := cmd;                ( save it for the next pass )
504      END;
505      ( If we just panned cf, we want to keep the pen up for the 1st point.
506      IF (NOT pan_pen_up) THEN concat_str (cmd, ';PD' );
507         concat_str (cmd, ';GA' );            ( The GA MUST be sent after the
508                                                or the DX will be ignored (thi
509                                                a display bug). )
510      out_disp_string( display_path, cmd ) ;
511      display_end ;
512      cmd := "PD" ;
513      integer_string (start, 4, ADDR(cmd)) ;
514      append_char (cmd, ';') ;
515      (* quad_string s16_quad( start ), 4, s ) ;
516      moveleft( s[1], cmd[3], 4 ) ;                                  *)
517      out_disp_string( display_path, cmd ) ;
518      release_display ;
519   END;
520
521
522
523
524  $ GLOBPROC ON $
525  (*********************************************************
526  (   Display a single trace bucket: This routine is called by the
527      trace processor if the display is not ready to accept
528      data in a reasonable period of time.  This routine should
529      be called by the trace processor only!
530                                                           )
531  PROCEDURE display_trace_bucket( bucket : signed_16 ) ;
532  VAR
533       was_cur_disp_trace : integer ;
534
535  BEGIN
536       was_cur_disp_trace := cur_disp_trace ;
537       IF trace_has_display THEN BEGIN
538          release_polled_output (display_path) ;
539          out_word(display_path, word( bucket )) ;
540          release_resource( gem ) ;
541          trace_has_display := false ;
542          END ;
543       acquire_trace_display( was_cur_disp_trace ) ;
544  END ;
545
546
547  $ GLOBPROC ON $
548  (*********************************************************
```

Apr 27 09:37 1989 disp_trac.P Page 12

```
551    ( For the ram routine ONLY, set the gem's pen down.
552    ( This occurs after the 1st point is sent to the gem after panning
553    ( the center frequency.  The 1st point is sent with the pen up to
554    ( to avoid lines originating off the screen.  (Erik)
555
556  PROCEDURE pan_put_pen_down;
557
558  VAR
559      cmd: string;
560
561  BEGIN
562      was_cur_disp_trace := cur_disp_trace;
563      IF trace_has_display THEN BEGIN           ( in case gem went away
564         release_polled_output (display_path);  ( one of two gem i/o mod
565         display_end;                           ( send end of message to
566         cmd := 'PD;GA#!';                      ( pen down, graph absolu
567         out_disp_string (status_path, cmd);
568         pan_pen_up := false;                   ( note to ourselves )
569         release_resource (gem);                ( cmd gets sent now )
570         trace_has_display := false;
571         END;
572      acquire_trace_display (was_cur_disp_trace);
573  END;
574
575  $ GLOBPROC ON $
576  (*********************************************************
577  (     Send an entire trace to the display
578                                                           )
579  PROCEDURE display_trace( trace : integer ) ;
580
581  VAR
582       i, buckets : integer ;
583       trace_cond : trace_cond_addr ;
584
585  BEGIN
586       IF trace < 3 THEN BEGIN
587
588          IF NOT hide_next_trace THEN BEGIN        $ OPTIMIZE OFF $
589             trace_cond := get_trace_cond( trace ) ;
590             buckets := state.num_buckets ;
591             IF trace_cond^.length < buckets THEN
592                buckets := trace_cond^.length
593             acquire_resource( trace_resource ) ;
594             display_set_trace_start( trace, 0 ) ;
595             acquire_trace_display( trace ) ;
596             IF trace_has_display
597                THEN send_trace( get_trace_addr( trace ), buckets ) ;
598             release_trace_display ;              $ OPTIMIZE ON $
599
600
```

```
601            set_new_start_bucket ;
602            release_resource( trace_resource ) ;
603            marker_trace( trace, true ) ;
604          END ELSE
605            hide_next_trace := FALSE;
606        END;
607      END ;
608
609    $ GLOBPROC ON $
610    (******************************************************)
611    (    Clear the current display window                  )
612    (******************************************************)
613    PROCEDURE clear_screen;
614
615    VAR
616      cmd : string19 ;
617
618    BEGIN
619    (*
620      acquire_display ;
621      out_disp_string( display_path, 'PG;' ) ;
622      release_display ;
623    *)
624    END ;
625
626    $ GLOBPROC ON $
627    (******************************************************)
628    (    Delete a trace from the screen                    )
629    (******************************************************)
630    PROCEDURE disp_blank_trace( trace : integer ) ;
631
632    VAR
633      cmd : string19 ;
634
635    BEGIN
636      IF trace < 3
637      THEN BEGIN
638        cmd := '' ;
639        group_item_string (trace_group, trace + 1, cmd ) ;
640        concat_str (cmd, 'DL;') ;
641
642        ( 'GPx;1Tx;DL;' )
643
644        acquire_display ;
645        out_disp_string( display_path, cmd ) ;       ( trace A )
646        IF (trace = 0)                                ( clean up old persist t
647          THEN erase_all_persist(TRUE);
648        release_display ;
649        marker_trace( trace, false ) ;
650
651          END ;
652        END ;
653
654    $ GLOBPROC ON $
655    (******************************************************)
656    (   Update the video average annunciator              )
657    (   This is called by processes wanting to update video average
658    (******************************************************)
659    PROCEDURE update_vavg_disp ;
660
661    BEGIN
662      annunciator_on_off( ann_video_avg, state.video_average ) ;
663      IF state.video_average THEN
664        need_curr_val (ann_video_avg);
665    END ;
666
667
668    $ GLOBPROC ON $
669    (******************************************************)
670    (   Update the video average annunciator              )
671    (   This is called by display process after being signalled by above
672    (******************************************************)
673    PROCEDURE update_vavg_now ;
674
675    CONST
676      str_len = 9;
677
678    VAR
679      s : PACKED ARRAY[0..str_len] OF char ;
680
681    BEGIN
682      s := '' ;
683      lreal_string( get_avg_count, str_len, ADDR(s), f()x_fmt, 0, false,
684                                            false, no_justify, false );
685      display_annotate( ann_video_avg, s ) ;
686    END ;
687
688    $ GLOBPROC ON $
689    (******************************************************)
690    (   Send a trace to the display if it is on, blank it otherwise
691    (******************************************************)
692    PROCEDURE update_trace( trace : integer ) ;
693
694    VAR
695      traces : ptr_trace_states_type ;
696
697    BEGIN
698      IF trace < 3 THEN BEGIN
699        traces := get_trace_states_type ;
700
```

```
901
902  $ GLOBPROC OFF $
903  (*****************************************************
904  ( For optical module, want to blank the LO feedthrough from the screen.
905  ( Do this by blanking beyond the filter skirt (10*RBW), and beyond
906  ( sweep inaccuracies (2% SPAN). Below 10MZ, FFS makes errors negligible.
907  ( Never show below 100KZ and don't blank inaccuracies above 60MZ.
908  (*****************************************************
909  PROCEDURE check_lo_feedthrough;
910  VAR
911    limit_freq: longreal;
912    limit_bucket: longreal;
913  BEGIN
914    WITH state DO BEGIN
915      IF span > OLO THEN BEGIN
916        limit_freq:= 10L0 * res_bw;
917        IF span > 10L6 THEN limit_freq:= limit_freq + min( 0.02L0 * span,
918                                          limit_freq := max (limit_freq, 100L3);
919        IF start_freq < limit_freq THEN BEGIN
920          limit_bucket := (limit_freq - start_freq)
921                        * ( longreal(num_buckets) / span );
922          IF limit_bucket > 32000L0 THEN limit_bucket := 32000L0;
923          new_end_ground := imax (new_end_ground,
924                                  integer(real_ceiling(limit_bucket)));
925          need_grounding := TRUE;
926        END;
927      END;
928    END;
929  END;
930
931  (*****************************************************
932  PROCEDURE end_of_trace ;
933
934  VAR
935    i : integer ;
936    traces : ptr_trace_states_type ;
937
938  BEGIN
939    traces := get_trace_states_type ;
940    display_go ;
941    IF NOT( trace_stopped ) THEN BEGIN
942      trace_stopped := true ;
943      suspend_count := suspend_count + 1 ;
944      clear_flag( not_suspend_trace ) ;
945    END ;
946    trace_done ;
947    IF (persist_on)
948      THEN IF (active_trace = 0)
949        THEN bump_persist_trace;
950    FOR i := 0 TO 2 DO
951      WITH traces^[i] DO
952        IF ( display ) AND
953           (( hold <> trace_off ) OR ( TRBPATH > 0 )) AND
954           ( i <> active_trace ) THEN
955          display_trace( i ) ;
956    IF trace_counter = 1 THEN
957      annunciator_on_off( ann_data_invalid, false ) ;
958    trace_counter := min( trace_counter+1, max_int16-1 ) ;
959    couple_avg_counter ;
960    limit_end_sweep;
961    update_time_disp ;
962  END ;
963
964  $ GLOBPROC OFF $
965  (*****************************************************
966  PROCEDURE process_trace_break ;
967
968  VAR
969    last_bucket : signed_16 ;
970    trace_ptr : trace_addr ;
971
972  BEGIN
973    last_bucket := next_bucket - 1 ;
974    WHILE last_bucket >= markers[next_marker].bucket DO BEGIN
975      trace_ptr := get_trace_addr( markers[next_marker].trace ) ;
976      marker_found( markers[next_marker].number,
977                    trace_ptr^[last_bucket] ) ;
978      next_marker := next_marker + 1 ;
979    END ;
980    IF limit_testing THEN IF (limit_fail <> 0) THEN limit_just_failed;
981  END ;
982
983  $ GLOBPROC OFF $
984  (*****************************************************
985  PROCEDURE take_data ;
986
987  BEGIN
988    ( Compute location of next trace break )
989    next_break := stop_bucket ;
990    IF markers[next_marker].bucket < next_break-1 THEN
991      next_break := markers[next_marker].bucket+1 ;
992    IF next_bucket >= next_break THEN BEGIN
993      trace_reg.count_till_break := 0 ;
```

Apr 25 17:12 1989 disp_util.P Page 16

```
751      vv := ROUND (temp_long);
752      temp_long := temp_long + (longreal (ww) - temp_long) * ymultiplier;
753      check_ovflow;
754      ww := ROUND (temp_long);
755      uu := ROUND (longreal (state.num_buckets) * xmultiplier);
756      tt := 0;
757      disp_lower := vv;
758      temp_long := tmax + dots_per_line * tsize / longreal (ylen - three_li
759      check_ovflow;
760      disp_upper := ROUND (temp_long);
761      disp_upper_clip := (signed_32 (disp_upper) + tmax) / 2;
762      disp_lower_clip := tmin;
763    END;                                                              $ OPTIMI
764
765   (*******************************************************************)
766   PROCEDURE update_dscale_nocalc;
767
768   VAR
769      status_path : integer;
770
771   BEGIN   $OPTIMIZE ON$
772      status_path := display_path;
773      IF NOT ovflow THEN
774         send_scale (status_path, tval, uval, vval, wval);
775   END;    $OPTIMIZE OFF$
776
777
778   (*******************************************************************)
779   $PAGE$
780   $TITLE "set_scale"$
781   (*******************************************************************)
782   PROCEDURE update_disp_scale;
783
784   CONST
785      div_per_screen = 10L0;
786
787   VAR
788      status_path : integer;
789      tsize, tmax, tmin : integer;
790      state : ptr_meas_state_type;
791      three_lines : integer;
792      i : byte;
793      tempstr: PACKED ARRAY [0..59] OF CHAR;
794      dsp_cmd : PACKED ARRAY [0..19] OF CHAR;
795
796   BEGIN   $OPTIMIZE ON$
797      status_path := display_path;
798      calculate_scale (tval, uval, vval, wval, ovflow);
799      IF (ovflow) AND (NOT flat_or_narrow) THEN
800
```

Apr 25 17:12 1989 disp_util.P Page 17

```
801         add_cntl_error (er_scale_overflow);                           $OPTIMIZE OFF$
802      IF NOT ovflow THEN
803         BEGIN       $OPTIMIZE ON$
804            blank_traces;
805            acquire_display;
806      (*   ( blank persistence traces )
807            erase_all_persist(TRUE);                                   ( TRUE; use out_disp_str
808            send_scale (status_path, tval, uval, vval, wval);
809            group_string (trace_group, tempstr);
810            concat_str (tempstr, zero_org);
811            out_disp_string (status_path, tempstr);
812            group_string (marker_group, tempstr);
813            concat_str (tempstr, zero_org);
814            out_disp_string (status_path, tempstr);
815            ('GPx;OR0,0;GPx;OR0,0;' )
816            group_string (persist_group, tempstr);
817            concat_str (tempstr, zero_org);
818            out_disp_string (status_path, tempstr);
819            (SET UP TRACE DELTA AND PUT PEN DOWN)
820            group_string (trace_group, tempstr);
821            concat_str (tempstr, 'IT1;DX1;');
822            select_pen (trace_a_pen, FALSE, tempstr);
823            concat_str (tempstr, 'PD;IT2;DX1;');
824            select_pen (trace_b_pen, FALSE, tempstr);
825            concat_str (tempstr, 'PD;IT3;DX1;');
826            select_pen (trace_c_pen, FALSE, tempstr);
827            concat_str (tempstr, 'PD;');
828            out_disp_string (status_path, tempstr);
829            FOR i := PERSIST_ITEM_OFFSET TO PERSIST_ITEM_OFFSET+MAX_PERSIST_
830         DO BEGIN
831            group_item_string (persist_group, i, tempstr);
832            concat_str (tempstr, 'DX1;');                              ( delt) x of 1, pen 1 )
833            select_pen (trace_a_pen, FALSE, tempstr);                  ( add in incr of trace_a
834            out_disp_string (status_path, tempstr);
835         END;
836         release_display;
837         update_disp_line;
838         update_mml_line;
839         move_rl_pos;
840         update_threshold;
841         new_meas_state;                                               (update trace conds and couple markers)
842         update_traces;
843
844
845         END;    $OPTIMIZE OFF$
846
847   (***********************************************************************)
848   PROCEDURE scale_it;
849
850
```

```
351  )
352  PROCEDURE get_cz_op ( VAR tempx, tempy:longreal; VAR p1x, p1y, p2x, p2y:
353  VAR
354      dsp_cmd : PACKED ARRAY [0..19] OF CHAR ;
355                                                              $ OPTIMIZE ON $
356  BEGIN
357      dsp_cmd := "CZ;";
358      out_disp_string ( status_path, dsp_cmd);
359      tempx := get_display_number (abort);
360      IF NOT abort THEN
361      BEGIN
362          tempy := get_display_number (abort);
363          dsp_cmd:="OP;";
364          out_disp_string( status_path, dsp_cmd);
365      END;
366      IF NOT abort THEN
367      p1x:=INTEGER(get_display_number ( abort ));
368      IF NOT abort THEN
369      p1y:=INTEGER(get_display_number ( abort ));
370      IF NOT abort THEN
371      p2x:=INTEGER(get_display_number ( abort ));
372      IF NOT abort THEN
373      p2y:=INTEGER(get_display_number ( abort ));
374  END;                                                        $ OPTIMIZE OFF $
375  (*****************************************************************)
376  (                                                                 )
377  (     get a string from the display                               )
378  (                                                                 )
379  SEE THE WARNING NEAR THE TOP OF IO_TASK.P AND THE COMMENT AT path_off_ac
380  IN THIS FILE.
381  )
382  PROCEDURE get_disp_string(VAR str:string; VAR abort: boolean; maxsize: i
383  VAR
384      end_found : boolean;
385      pkt       : cmd_packet;
386      size      : integer;
387                                                              $ OPTIMIZE ON $
388  BEGIN
389      str := "";                                              ( no id yet )
390      size := 0;
391      end_found := FALSE;
392      WHILE NOT (abort OR end_found)                          ( still some to
393      DO BEGIN
394          pkt := get_display_byte(abort);
395          IF (NOT abort)                                      ( got something
396          THEN BEGIN
397              IF (pkt.command = msg_end)                      ( end of the mes
398              THEN BEGIN
399                  end_found := TRUE
400              END
401              ELSE BEGIN                                      ( must be data )
402                  IF (size < maxsize)                         ( room to keep i
403                  THEN BEGIN
404                      append_char(str, pkt.cinfo)
405                      size := size + 1;
406                  END;
407              END;
408          END;                                                ( of not abort )
409      END;
410  END;                                                        $ OPTIMIZE OFF $
411  (*****************************************************************)
412  (     does this display support color?                            )
413  PROCEDURE get_disp_has_color(VAR has_color: boolean; VAR abort: boolean)
414  (
415  SEE THE WARNING NEAR THE TOP OF IO_TASK.P AND THE COMMENT AT path_off_ac
416  IN THIS FILE.
417  )
418  VAR
419      end_found : boolean;
420      i         : integer;
421      c         : char;
422      color_cmd : PACKED ARRAY [0..15] OF CHAR;
423  BEGIN                                                       $ OPTIMIZE ON $
424      color_cmd := "OYDM;";                                   ( output capabil
425      out_disp_string (status_path, color_cmd);               ( drawing modes?
426      get_disp_string(color_cmd, abort, 15);                  ( and get it )
427      has_color := FALSE;                                     ( not yet found
428      i := 1;                                                 ( first characte
429      WHILE (i <= byte(color_cmd[0]))                         ( look at the re
430      DO BEGIN
431          c := color_cmd[i];
432          IF ( (c >= '0') AND (c <= '9') )                    ( avoid reindexi
433          THEN BEGIN                                          ( this is the di
434              has_color := (color_cmd[i] = '2');              ( look at the re
435              i := 256;                                       ( exit the loop
436          END
437          ELSE BEGIN
438              i := i + 1;                                     ( keep looking )
439          END;
440      END;
441  END;                                                        $ OPTIMIZE OFF $
442  (*****************************************************************)
443  (     get the display type                                        )
444  PROCEDURE get_disp_type(VAR old_disp: boolean; VAR abort: boolean);
445  (
446  SEE THE WARNING NEAR THE TOP OF IO_TASK.P AND THE COMMENT AT path_off_ac
447  IN THIS FILE.
448  )
449
```

Apr 26 11:56 1989  display.P Page 10

```
451    has_color     : BOOLEAN;
452    i             : integer;
453    compare       : PACKED ARRAY [0..15] OF CHAR;
454    cmd           : PACKED ARRAY [0..15] OF CHAR;
455    BEGIN                                                           $ OPTIMIZE ON  $
456       old_disp := TRUE;                                            ( old is the def
457       IF (NOT abort)
458       THEN BEGIN
459          cmd := "00;";                                             ( output options
460          out_disp_string (status_path, cmd);                       ( do the query )
461          get_disp_string(cmd, abort, 15);                          ( and get the re
462          IF (NOT abort)
463          THEN BEGIN
464             compare := "0,1,0,0,0,0,0,0";                          ( pattern: old d
465             IF (cmd <> compare)                                    ( do they differ
466                THEN old_disp := FALSE;                             ( yes: new dispt
467                                                                    ( of inner not a
468          END;                                                      ( of outer not a
469    END;                                                            $ OPTIMIZE OFF $
470    (*************************************************************************)
471    $PAGE$
472    $TITLE "SELECT PEN"$
473    (*************************************************************************)
474    $GLOBPROC ON$
475    PROCEDURE select_pen(which_pen: pen_types; two_digits: boolean;
476                        VAR str: string);
477    $GLOBPROC OFF$
478    TYPE
479       pen_choice = (new_normal, new_persist, old_normal, old_persist);
480    VAR
481       pen           : byte;
482       choice        : pen_choice;
483    $EXTVAR ON$
484    pen_array: ARRAY [pen_types, pen_choice] OF BYTE;
                                                ( the actual table is in util.s
485    $EXTVAR OFF$
486    BEGIN
487       IF (old_display)                                              ( 5.0 or 6.0, monochrome )
488       THEN BEGIN
489          IF persist_on
490             THEN choice := old_persist
491             ELSE choice := old_normal
492       END
493       ELSE BEGIN                                                    ( color or newer monochrome )
494          IF persist_on
495             THEN choice := new_persist
496             ELSE choice := new_normal
497       END;
498       pen := pen_array[which_pen, choice];                          ( table lookup )
499       concat_str(str, "sp");                                        ( select pen command )
```

Apr 26 11:56 1989  display.P Page 11

```
501       IF (two_digits) THEN                                  ( must be a two digit field )
502          IF (pen < 10) THEN                                 ( but integer string only needs
503             append_char(str,'0');                           ( so insert a leading zero )
504       integer_string(pen, 2, str);
505       append_char (str, ';');
506    END;
507    (*************************************************************************)
508    ( setup_trace )
509    (
510       The procedure setup_trace is called when a status link is establishe
511    with a display or anytime the normal screen is to be rebuilt (dspmode
512    change, iwindow ). Its purpose is to OR the trace group (GPx) to the
513    lower left of the graticule. It is called by setup_screen and is
514    local to this file.
515    )
516    PROCEDURE setup_trace (x1, x2, y1, y2, xlength, ylength, dots_line : int
517    VAR
518       dsp_cmd : PACKED ARRAY [0..31] OF CHAR ;
519
520       PROCEDURE setup_trace_sub(which_group: integer);
521       BEGIN
522          (set up for trace)
523          group_string (which_group, dsp_cmd) ;
524          concat_str (dsp_cmd, 'OR') ;
525          ( 'GPx;OR' )
526          integer_string (x1, 4, dsp_cmd) ;
527          append_char (dsp_cmd,',') ;
528          integer_string (y1+(2*dots_line), 4, dsp_cmd) ;
529          append_char (dsp_cmd,';') ;
530          out_disp_string( status_path, dsp_cmd);
531       END;
532
533    BEGIN
534       setup_trace_sub(trace_group);
535       setup_trace_sub(persist_group);
536    END;
537    (*************************************************************************)
538    PROCEDURE setup_grat (x1, x2, y1, y2, xlength, ylength, dots_line : inte
539    ( setup_grat )
540    (
541       The procedure setup_grat is called when a status link is established
542    with a display or when the normal screen is rebuilt (dspmode change,
543    iwindow). Its purpose is to OR the graticule (Group lines_group, item
544    the left edge of the screen and two rows up from the bottom. It also
545    draws the graticule by sending the GT command. It also draws ticks
546    at the center of the graticule in the x and y dimensions. It is called
547    by setup_screen and is local to this file.
```

```
551  )
552                                                                        $ OPTIMIZE ON  $
553  VAR
554     dsp_cmd : PACKED ARRAY [0..29] OF CHAR ;
555
556  BEGIN
557     (setup graticule)
558     dsp_cmd:="VU0:LT7;";
559     select_pen(grat_pen,FALSE,dsp_cmd);
560     concat_str(dsp_cmd,"GT");                     ( GRATICULE ITSELF )
561     config_annun(status_path,lines_group,3,0,2*dots_line,dsp_cmd);
562     dsp_cmd := "" ;
563     integer_string (ROUND(0.1L0*length)),4,dsp_cmd) ;
564     append_char (dsp_cmd,',') ;
565     integer_string (ROUND(0.1L0*(ylength-(3*dots_line))),4,dsp_cmd) ;
566     concat_str(dsp_cmd,',10,10;') ;
567
568  (* quad_string(s16_quad(ROUND(0.1L0*length)),4,dsp_cmd);
569     out_disp_string(status_path,dsp_cmd);
570     out_disp_string(status_path,",");
571     quad_string(s16_quad(ROUND(0.1L0*(ylength-(3*dots_line))),4,dsp_cmd
572     out_disp_string(status_path,dsp_cmd);
573     dsp_cmd:=",10,10;";                                            *)
574
575     out_disp_string(status_path,dsp_cmd);
576     (GROUP lines_group, ITEM 7, TICKS AT CENTER OF GRATICULE)
577  END;                                                      $ OPTIMIZE OFF $
578  (*******************************************************************)
579  PROCEDURE setup_saved_udc;
580  ( setup_saved_udc )
581
582  ( The procedure setup_saved_udc is called when a status link is est-
583    ablished with a display. Its purpose draw user defined characters which
584    include <cr>,<lf>,<esc>,<etx>,and the two rlpos indicators. This
585    procedure is called by disp_is_on and is local to this file.
586  )
587  VAR
588     dsp_cmd : PACKED ARRAY [0..99] OF CHAR ;
589
590  BEGIN
591    (DEFINE SPECIAL CHARACTERS NEEDED)
592    (assign etx to 0 )
593    dsp_cmd :=
594       'SU0,-99,0,14,6,0,+99,-4,0,0,-2,2,0,-2,0,0,-2,4,0,-99,0,-2,4,0,+99,
595    out_disp_string(status_path,dsp_cmd);
596
597    (assign esc to 1 )
598    dsp_cmd :=
```

```
601       'SU1,-99,0,14,6,0,+99,-4,0,0,-2,2,0,-2,0,0,-2,4,0,-99,0,-2,4,0,+99,
602    out_disp_string(status_path,dsp_cmd);
603
604    (assign CR to 3 )
605    dsp_cmd :=
606       'SU3,-99,0,14,6,0,+99,-3,0,-1,-1,0,-2,1,-1,3,0,-99,0,4,3,
607    out_disp_string(status_path,dsp_cmd);
608
609    (assign LF to 2 )
610    dsp_cmd :=
611       'SU2,-99,0,14,2,0,+99,0,-4,4,0,-99,0,-2,4,0,+99,-4,0,0,-2,3,0,-3,0
612    out_disp_string(status_path,dsp_cmd);
613
614    (RLPOS indicators, left and right )
615    out_disp_string(status_path,'SU4,-99,7,0,+99,0,5,5,-5,-5,-5,0,5;');
616    out_disp_string(status_path,'SU5,-99,-7,0,+99,0,5,-5,-5,5,5,0,5;');
617    out_disp_string (status_path,'CA30;');    (selects user chars as alter
618  END;                                                    $ OPTIMIZE OFF $
619  (*******************************************************************)
620  PROCEDURE setup_screen (x1, x2, y1, y2, dots_per_l,dots_per_c,
621                          xln,yln : integer ) ;
622  VAR
623     temp : longreal;
624     dsp_cmd     : PACKED ARRAY [0..99] OF CHAR ;
625  (* str : PACKED ARRAY [0..23] OF CHAR ; *)
626     lower_x,upper_x,lower_y,upper_y : integer ;
627     save_len : char;
628
629  BEGIN
630
631    (PUT GRATICULE IN GROUP lines_group, ITEM 3 )
632
633    setup_grat (p1x, p2x, p1y, p2y, xlen, ylen, dots_per_l);  (GRATICULE
634
635    ( SETUP GROUP eos_group ANNOTATION )
636
637    IF annotate THEN
638    BEGIN
639       ( ITEM 1 = UPPER LEFT )
640       ( ITEM 2 = LOWER LEFT )
641       ( ITEM 3 = UPPER RIGHT, MARKERS )
642       ( ITEM 4 = UNCOR, UNCAL, * )
643       ( ITEM 5 = VIDEO AVG )
644       ( ITEM 6 = LOWER RIGHT )
645       ( ITEM 7 = TITLE LINE )
646       ( ITEM 8 = PASS/FAIL )
```

```
651     ( ITEM 10 = text window )
652     group_string (eos_group, dsp_cmd);
653     concat_str (dsp_cmd, 'VW0;') ;
654     out_disp_string (status_path, dsp_cmd) ;
655
656     dsp_cmd := '';
657     select_pen(eos_pen,FALSE,dsp_cmd);              ( select pen command )
658     save_len := dsp_cmd[0];                          ( save this command )
659     concat_str(dsp_cmd,'CL3,32;');
660     config_annun(status_path,eos_group,1,p1x,p2y-dots_per_l,dsp_cmd);
661     dsp_cmd[0] := save_len;                          ( restore select pen com
662     concat_str(dsp_cmd,'CL2,35;');
663     config_annun(status_path,eos_group,2,p1x,p1y+dots_per_l,dsp_cmd);
664     dsp_cmd[0] := save_len;
665     concat_str(dsp_cmd,'CL2,31;');
666     config_annun(status_path,eos_group,3,p2x-(31 * dots_per_c),
667                                          p2y-dots_per_l,dsp_cmd);
668     dsp_cmd := '';
669     select_pen(un_pen,FALSE,dsp_cmd);                ( select pen command )
670     concat_str(dsp_cmd,'CL1,21;');                   ( save this command )
671     config_annun(status_path,eos_group,4,p2x-(21 * dots_per_c),
672                                          p2y- 4 * dots_per_l,dsp_cmd);
673     dsp_cmd := '';
674     select_pen(eos_pen,FALSE,dsp_cmd);
675     save_len := dsp_cmd[0];
676     concat_str(dsp_cmd,'CL1,6;');
677     config_annun(status_path,eos_group,5,p1x+dots_per_c,
678                                          p2y - ( 10 * dots_per_l),dsp_cmd
679     dsp_cmd[0] := save_len;                          ( restore select pen com
680     concat_str(dsp_cmd,'CL2,25;');
681     config_annun(status_path,eos_group,6,p2x-(25 * dots_per_c),
682                                          p1y+dots_per_l,dsp_cmd);
683     dsp_cmd := '';
684     select_pen(title_line_pen,FALSE,dsp_cmd);
685     concat_str(dsp_cmd,'CL1,');
386     integer_string (columns_in_window - columns_in_window.DIV 3, 4, ds
687     append_char ( dsp_cmd, ';') ;
688     config_annun(status_path,eos_group,7,
689              p1x+dots_per_c * ( columns_in_window DIV 3 ),p2y-3*dots_per_l,ds
690     (config_annun(status_path,eos_group,8,p1x+( 24 * dots_per_c),
691                                          p1y + dots_per_l,'SP3;CL1,14;');
692
693
694     END;    (ANNOTATE )
695
696     ( SET UP ACTIVE PARAMETER AREA )
697
698     IF act_parm_win
699     THEN BEGIN
700         dsp_cmd := '';
701         select_pen(actparm_pen,FALSE,dsp_cmd);
702         concat_str(dsp_cmd,'CL5,21;VW1;');
703         IF annotate THEN config_annun(status_path,annot_group,1,
704                                       p1x+dots_per_c,p1y-(5*dots_per_l),
705                                       dsp_cmd) (act parm)
706                     ELSE config_annun(status_path,annot_group,1,
707                                       p1x+dots_per_c,p1y-(2*dots_per_l),
708                                       dsp_cmd);(act parm)
709     END;
710
711     ( SET UP MESSAGE WINDOW )                        $ OPTIMIZE OFF $
712                                                      $ OPTIMIZE ON  $
713     IF mess_win THEN
714     BEGIN
715         dsp_cmd := 'CL2,20;LB' ;
716         append_char(dsp_cmd,formfeed);
717         append_char(dsp_cmd,etx);
718         select_pen(eos_pen,FALSE,dsp_cmd);
719         config_annun(status_path, annot_group,6,
720                      p2x-(21*dots_per_c),p2y-(5*dots_per_l),dsp_cmd);
721                                                      (MESSAGE AREA)
722     (box the message window )
723
724     lower_x := p2x-21*dots_per_c-(dots_per_c DIV 3) ;
725     upper_x := p2x-dots_per_c;
726     lower_y := p2y-(6*dots_per_l) ;
727     upper_y := p2y-(4*dots_per_l) ;
728
729     group_item_string (annot_group,7, dsp_cmd ) ;
730     select_pen (eos_pen, FALSE, dsp_cmd);
731     concat_str (dsp_cmd, 'VW0;PD;PA') ;
732     integer_string (lower_x, 4, dsp_cmd) ;           (upper left hand corne
733     append_char (dsp_cmd, ',') ;
734     integer_string (upper_y, 4, dsp_cmd) ;
735     append_char (dsp_cmd, ',') ;
736     integer_string (lower_x, 4, dsp_cmd) ;           (lower l  c hand corne
737     append_char (dsp_cmd, ',') ;
738     integer_string (lower_y, 4, dsp_cmd) ;
739     append_char (dsp_cmd, ',') ;
740     integer_string (upper_x, 4, dsp_cmd) ;           (lower right hand corne
741     append_char (dsp_cmd, ',') ;
742     integer_string (lower_y, 4, dsp_cmd) ;
743     append_char (dsp_cmd, ',') ;
744     integer_string (upper_x, 4, dsp_cmd) ;           (upper right hand corne
745     append_char (dsp_cmd, ',') ;
746     integer_string (upper_y, 4, dsp_cmd) ;
747     append_char (dsp_cmd, ',') ;
748     integer_string (lower_x, 4, dsp_cmd) ;           (upper left hand corner
749     append_char (dsp_cmd, ',') ;
750     integer_string (upper_y, 4, dsp_cmd) ;
```

```
Apr 26 11:56 1989  display.P Page 16

751        append_char (dsp_cmd, ';') ;
752
753        ( 'SP10;GPx;IT7;VW0;PD;PA' )
754
755        out_disp_string( status_path, dsp_cmd)
756     END;
757
758    ( SET UP ERROR WINDOW )
759
760    IF err_win
761    THEN BEGIN
762        dsp_cmd := '';
763        select_pen(err_wind_pen,FALSE,dsp_cmd) ;
764        concat_str(dsp_cmd,'CL11,20:VW1;');
765        config_annun(status_path,annot_group,5,
766                    p2x-(2)*dots_per_c),p2y-(7*dots_per_l),
767                    dsp_cmd);
768    END;
769
770    ( SET UP MARKERS )
771
772    group_string (marker_group, dsp_cmd) ;
773    concat_str (dsp_cmd, 'OR') ;
774    integer_string (p1x,4,dsp_cmd) ;
775    append_char (dsp_cmd,',') ;
776    integer_string (p1y+(2*dots_per_l),4,dsp_cmd) ;
777    append_char (dsp_cmd,';') ;
778
779    out_disp_string( status_path, dsp_cmd);
780    group_item_string (marker_group, 6, dsp_cmd) ;
781
782    select_pen(marker_pen,FALSE,dsp_cmd);
783    concat_str(dsp_cmd,"MA ,0;IT1;"");
784    select_pen(marker_pen,FALSE,dsp_cmd) ;
785    concat_str(dsp_cmd,"MA ,0;IT2;"");
786    select_pen(marker_pen,FALSE,dsp_cmd);
787    concat_str(dsp_cmd,"MA ,0;IT3;"");
788    select_pen(marker_pen,FALSE,dsp_cmd);
789    concat_str(dsp_cmd,"MA ,0;IT4;"");
790    select_pen(marker_pen,FALSE,dsp_cmd);
791    concat_str(dsp_cmd,"MA ,0;IT5;"");
792    select_pen(marker_pen,FALSE,dsp_cmd);
793    concat_str(dsp_cmd,"MA ,0;"");
794
795    out_disp_string( status_path, dsp_cmd);
796
797    (SET UP DISPLAY LINE)
798
799    dsp_cmd := '';
800    select_pen(disp_line_pen,FALSE,dsp_cmd);

Apr 26 11:56 1989  display.P Page 17

801    concat_str(dsp_cmd,'PA0,0;PD;PA');
802    config_annun(status_path,lines_group,4,0,0,dsp_cmd);
803    dsp_cmd := '';             ( already output by config_ann )
804    integer_string (x1n,4,dsp_cmd) ;
805
806    (* quad_string(s16_quad(x1n),4,dsp_cmd);       *)
807
808    out_disp_string(status_path, dsp_cmd);
809    out_disp_string(status_path, ',0;VW0;');
810
811    (SET UP RLPOS INDICATORS)
812
813    dsp_cmd := '';
814    select_pen(err_wind_pen,TRUE,dsp_cmd);              ( SPxx )
815    concat_str(dsp_cmd, 'CL1,1;SA;LB>';VW0:SS;');
816                                        ( directly indexed: be c
817                                          in changing this strin
818    dsp_cmd[17] := CHR (52) ;
819    dsp_cmd[18] := etx;
820    config_annun(status_path,lines_group,5,0,0,dsp_cmd);
821    dsp_cmd[17] := CHR(53);
822    config_annun(status_path,lines_group,6,0,0,dsp_cmd);
823
824    ( OR the trace to the correct location )
825
826    setup_trace (p1x, p2x, p1y, p2y, x1n, y1n, dots_per_line ) ;
827
828    (SET UP TRACE DELTA AND PUT PEN DOWN)
829    group_string ( trace_group, dsp_cmd) ;
830    concat_str (dsp_cmd, 'DX1;PD;' ) ;
831    ( 'GPx;DX1;PD;' )
832    out_disp_string( status_path, dsp_cmd);
833    group_string ( persist_group, dsp_cmd) ;
834    concat_str (dsp_cmd, 'DX1;PD;' ) ;
835    ( 'GPx;DX1;PD;' )
836    out_disp_string( status_path, dsp_cmd);
837
838
839    END (of setup_screen PROCEDURE);
840
841    (*****************************************          $ OPTIMIZE OFF $
842    PROCEDURE calculate_screen_params (dots_per_l,dots_per_c,l_in_window,c_i
843    (local)
844
845    BEGIN                                               $ OPTIMIZE ON $
846
847        IF (c_in_window < 52) OR (l_in_window < 11) THEN annotate := FAL
848        ELSE annotate := TRUE;
849        IF ( c_in_window > 25 ) AND ( l_in_window > 4 ) THEN act_parm_wi
850        ELSE act_parm_win := FALSE;
        IF ( c_in_window > 47 ) AND (l_in_window > 20 ) THEN err_win :=
```

```
1001            END
1002          ELSE
1003            create_window (temp_p1x, temp_p2x, temp_p1y, temp_p2y, temp_d_per_
1004                           temp_x_len, temp_y_len );
1005
1006        END ;
1007
1008 (********************************************************)
1009 $GLOBPROC ON$
1010 PROCEDURE re_do_window ;
1011 $GLOBPROC OFF$
012
013
1014 BEGIN
1015    calculate_window (xlen,ylen,dots_per_column,dots_per_line,
1016                      lines_in_window,columns_in_window,czx,czy) ;
1017    current_screen := state.dspmode ;
1018    IF state.dspmode = dsp_norm THEN
1019      dsp_screen (xmult, ymult, false)
1020    ELSE
1021      BEGIN
1022        dsp_screen (2L0, 2L0, true) ;
1023        dsp_text ;
1024      END;
1025 END ;
1026
1027 (********************************************************)
1028 ( DISP_IS_ON: a path on has been received for the disp)
1029
1030 PROCEDURE disp_is_on (VAR abort:boolean);
1031
1032 VAR
1033    tempstr : PACKED ARRAY [0..25] OF CHAR ;
1034
1035                                                $ OPTIMIZE ON $
 336 BEGIN
 037   (initialize display)
1038   acquire_display;
1039   out_disp_command(status_path, end_packet);
1040
1041   ( get_cz_op() eventually calls get_display_byte() which can (upon
1042     loss of the gem) call path_off_accepted() which also acquires the
1043     display (causing lockout since we just acquired the display.) We
1044     force path_off_accepted() to skip acquiring the display by setting
1045     disp_is_on_calling to TRUE. This is admittingly bad programming,
1046     but to save redesigning lots of code, this is a quick bug smasher.
1047     This bug only appeared with the new msib drivers and when pressing
1048     the DISPLAY PRESET menu choice multiple times quickly. Erik 1/9/87
1049   disp_is_on_calling := TRUE;
1050   get_disp_type(old_display, abort);
1051   IF (NOT abort)
1052     THEN get_disp_has_color(color_disp, abort)
1053     ELSE color_disp := FALSE;
1054   old_display := old_display AND (NOT color_disp);    ( 70004 display
1055                                                          return false o
1056                                                          display indica
1057   IF ((NOT abort) AND (NOT old_display))              ( turn off compa
1058     THEN out_disp_string (status_path, "CM0;");
1059   IF (NOT abort) THEN ( get_cz_op is last since it    ey not read the
1060                         entire returned string. )
1061   get_cz_op (czx, czy, p1x, p1y, p2x, p2y ,abort ) ;
1062   disp_is_on_calling := FALSE;
1063   setup_saved_udc;
1064   out_disp_string(status_path, 'DA0;');
1065   group_string(user_group, tempstr);
1066   concat_str(tempstr, "DL;SC0,100,0,100;");
1067   out_disp_string(status_path, tempstr);
1068   group_string(user_group, tempstr);
1069   concat_str(tempstr, 'OR0,0;');
1070   group_string(user_group, tempstr);
1071   release_display ;
1072   IF NOT abort THEN
1073     re_do_window ;
1074   IF cardaddr < 0 THEN
1075     cardaddr := LONGREAL (INTEGER(IO_PATHS(status_path).othr_addrs.(
1076                                                $ OPTIMIZE OFF $
1077
1078 END;
1079
1080 (********************************************************)
1081 ( Wake up the display process with a nop packet in order to get it to )
1082 ( look if it has to update any annunciators.                          )
1083
1084 $ GLOBPROC ON $
1085
1086 PROCEDURE wake_up_display (no_matter_what: boolean);
1087 BEGIN
1088   IF path_ready OR no_matter_what THEN
1089   IF test_fifo_empty (status_fifo) THEN
1090     put_fifo_word (status_fifo, word(nop_packet));
1091
1092 END;
1093
1094 $ GLOBPROC OFF $
1095
1096 (********************************************************)
1097 $TITLE "display_control MAIN BODY"$
1098 (********************************************************)
1099 PROCEDURE display_process;
1100 VAR
      pkt          : cmd_packet;
```

```
Apr 25 17:33 1989  exec_trac.P Page 8

351       BEGIN
352         state.num_buckets := num_buckets ;
353         IF num <> num_buckets THEN BEGIN
354           num_buckets := num ;
355           update_num_buckets ;
356           blank_traces ;
357           update_disp_scale ;
358           update_traces ;
359           marker_couple ;
360           cpl_swp_time ;
361           END ;
362         END ;
363
364
365  $ GLOBPROC ON $
366  (-----------------------------------------
367  (
368
369  PROCEDURE couple_num_buckets ;
370
371  VAR
372         cond : trace_cond_addr ;
373         i, num : integer ;
374
375       BEGIN
376         num := 32767 ;
377         FOR i := tra TO trc DO BEGIN
378           IF state.traces[i].hold <> trace_off THEN BEGIN
379             cond := get_trace_cond( i ) ;
380             num := imin( cond^.length, num ) ;
381             END ;
382           END ;
383         IF num = 32767 THEN
384           FOR i := tra TO trc DO BEGIN
385             IF state.traces[i].display THEN BEGIN
386               cond := get_trace_cond( i ) ;
387               num := imin( cond^.length, num ) ;
388               END ;
389             END ;
390         IF num <> 32767 THEN
391           set_num_buckets( num ) ;
392         END ;
393
394
395  $ GLOBPROC OFF $
396  (-----------------------------------------
397  (
398
399  PROCEDURE clear_write( trace : integer ) ;
400  VAR Apr 25 17:33 1989  exec_trac.P Page 9

401         tp : trace_addr ;
402         cond : trace_cond_addr ;
403         i : integer ;
404         cmd : PACKED ARRAY[0..15] OF CHAR;
405
406       BEGIN
407         WITH state.traces[trace] DO BEGIN
408           math := math_off ;
409           hold := trace_write ;
410           display := true ;
411           END ;
412         (
413         tp := get_trace_addr( trace ) ;
414         cond := get_trace_cond( trace ) ;
415         FOR i := 0 TO cond^.length-1 DO
416           tp^[i] := disp_lower_clip ;
417         )
418         clear_trace (trace);
419         build_func( state.traces ) ;
420         couple_num_buckets ;
421         couple_penning ;
422         copy_trace_cond( trace ) ;
423         cmd := '';
424         group_item_string (trace_group, trace + 1, cmd);
425         concat_str (cmd, 'DL;');
426         display_string (cmd);
427         IF (trace = 0)                              ( trace A )
428           THEN erase_all_persist(FALSE);            ( FALSE: use display_string )
429         marker_trace (trace, TRUE);
430         (
431         update_trace( trace ) ;
432         )
433         data_invalid ;
434         restart_sweep ;
435         END ;
436
437
438  $ GLOBPROC ON $
439  (-----------------------------------------
440  (
441
442  PROCEDURE exe_al( VAR source : command_source_type ;
443                        function : exectrn_function ) ;
444
445       BEGIN
446         clear_write( tra ) ;
447         END ;
448
449  $ GLOBPROC ON $
450  (-----------------------------------------
```

```
301             md process during marker track, and cannot call them.  )
302     BEGIN
303       new_setting_lo(false);
304       WITH state DO BEGIN
305         select_cmin_band;   ( This selects the default band for external mi
306         start_freq := md_set_start( start_freq );
307         show_freq_parm;
308       END ;
309       new_meas_state ;
310     END ;
311
312
313
314 (-------------------------------------------------------------------)
315 ( set start frequency   )
316
317 PROCEDURE set_start_freq( new_start : longreal ) ;
318 ( WARNING- you must call begin_update_sequence/end_update_sequence
319     when calling this routine. All other update_xxx routines
320     call them for you, but set_start_freq is called by the
321     md process during marker track, and cannot call them.  )
322 BEGIN
323   WITH state DO BEGIN
324     start_freq := new_start ;
325   END ;
326   update_start_freq ;
327 END ;
328
329 $ GLOBPROC OFF $
330
331
332 (-------------------------------------------------------------------)
333 ( Pan the trace immediately to give rough visual indication before   )
334 ( a new trace is displayed.                                          )
335
336 PROCEDURE pan_trace( current_cf, new_cf : longreal );
337
338 VAR
339   total_pan: longreal;
340   this_pan:  INTEGER;
341   i:         BYTE;
342   gistr:     PACKED ARRAY[0..11] OF char;
343   panstr:    PACKED ARRAY[0..39] OF char;
344 BEGIN
345   IF trace_on_screen AND trace_disp_ready THEN BEGIN
346     WITH state DO BEGIN
347       IF span > 1.0L0 THEN BEGIN
348         ( calculate how much to scoot the trace )
349         total_pan := (current_cf - new_cf) * num_buckets / span;
350         this_pan := ROUND (total_pan) - have_panned;
351         panstr := 'PN';
352         integer_string (this_pan, 5, ADDR(panstr));
353         concat_str (panstr, ';PU;');   (took out PR)
354         acquire_display;
355         IF ( (active_trace = 0) AND (persist_on) )
356         THEN BEGIN                    ( for persistence trace A )
357           FOR i := PERSIST_ITEM_OFFSET TO
358                    PERSIST_ITEM_OFFSET + num_persist_traces-1
359           DO BEGIN
360             IF (persist_trace_shown[i-PERSIST_ITEM_OFFSET])
361             THEN BEGIN
362               group_item_string (persist_group, i, gistr);
363               out_disp_string (status_path, gistr);
364               out_disp_string (status_path, panstr);
365             END
366           END
367         END
368         ELSE BEGIN                    ( for normal trace A, other trac
369           group_item_string (trace_group, active_trace+1, gist
370           out_disp_string (status_path, gistr);
371           out_disp_string (status_path, panstr);
372         END;
373         pan_pen_up := true;
374         release_display;
375         have_panned := have_panned + this_pan;
376       END;
377     END; (with)
378   END; (trace_on_screen)
379 END; (procedure)
380
381 (********************************************************************
382  WHEN CHANGES ARE BEING MADE TO THE TRACE ITSELF, WE HAVE TO STOP
383  THE MEASUREMENT DIRECTOR FOR MESSING WITH IT.  WHEN WE ARE DONE,
384  WE MUST REMEMBER TO ALLOW THE MANUAL PARSER CONTROL BEFORE THE
385  TRACE PROCESSOR GETS TO RUN (THANK GOODNESS IT HAS THE LOWEST
386  PROCESS PRIORITY).
387 ********************************************************************)
388
389 PROCEDURE freeze_trace;
390 BEGIN
391   IF NOT we_suspended_trace THEN BEGIN
392     we_suspended_trace := TRUE;
393     begin_update_sequence;
394     suspend_trace_processing;
395   END;
396 END;
397
398 PROCEDURE unfreeze_trace;
399 VAR
400
```

```
Apr 25 17:20 1989  exec_freq.P Page 9

401       temp_str: PACKED ARRAY[0..5] OF CHAR;
402   BEGIN
403     IF we_suspended_trace THEN BEGIN
404       resume_trace_processing;
405       end_update_sequence;
406       we_suspended_trace := FALSE;
407     END;
408   END;
409
410
411   PROCEDURE clip_string (start, length: integer; VAR foo: string);
412   BEGIN                                    ( adds 25 to string )
413     concat_str (foo, 'TP');
414     integer_string (start, 5, ADDR(foo));
415     concat_str (foo, ';BA');
416     integer_string (length, 5, ADDR(foo));
417     concat_str (foo, ';PU;GA0;PD;');
418   END;
419
420
421   (*****************************************************************
422     USING THE GEM COMMANDS: PN, SC, OR, AND DX, WE CAN QUICKLY CHANGE
423     THE LOOK OF THE CURRENTLY DISPLAYED TRACE.  INPUT TO THIS ROUTINE
424     SPECIFY RELATIVE CHANGE.  REL_START AND REL_SPAN IS BASED ON 0.0
425     BEING THE CURRENT START FREQUENCY AND 1.0 BEING THE CURRENT SPAN.
426     NOTICE THAT IF REL_START IS 1.0, THEN IT IS EQUAL TO THE CURRENT
427     STOP FREQUENCY (CURRENT START PLUS ONE SPAN).  IF REL_SPAN IS 2.0
428     THEN IT IS TWICE THE CURRENT SPAN.  IF REL_START IS -2.0 THEN IT IS
429     TWO SPANS LESS THAN THE CURRENT START FREQUENCY.  VALUES WITHIN 0.0
430     AND 1.0 INDICATE WITHIN THE CURRENT SPAN, OTHERS ARE OUTSIDE.  WE
431     ALSO NEED THE GLOBALS TVAL AND UVAL WHICH SPECIFY WHAT THE CURRENT
432     TRACE'S X-AXIS SCALE IS.
433                                                         EK 6/3/87
434   *****************************************************************)
435   PROCEDURE scale_trace (rel_start, rel_span: longreal);
436   VAR
437     new_uval, new_tval,
438     len, offset,
439     clip_left, clip_right : integer;
440     rel_sum               : longreal;
441     (use_holdoff           : boolean;)
442     i                     : integer;
443     gistr                 : PACKED ARRAY[0..11] OF CHAR;
444     tempstr               : PACKED ARRAY[0..106] OF CHAR;
445
446   BEGIN
447     last_rel_start := rel_start;
448     last_rel_span  := rel_span;
449
450     (*** CALCULATE NEW SCALE (TVAL, UVAL) ***)
```

```
Apr 25 17:20 1989  exec_freq.P Page 10

451     len      := uval - tval;
452     offset   := ROUND(len * rel_start);
453     new_tval := tval + offset;
454     new_uval := tval + offset + ROUND(len * rel_span);
455
456     (*** CALCULATE CLIPPING ***)
457     clip_left  := 0;
458     clip_right := 0;
459     IF (rel_start > 0.0L0) THEN
460       clip_left  := offset;
461     rel_sum    := rel_start + rel_span;
462     IF (rel_sum < 1.0L0) THEN
463       clip_right := ROUND(len * (1.0L0 - rel_sum));
464
465     freeze_trace;
466     tempstr := '';
467     IF (clip_left > 0) THEN
468       clip_string (0, clip_left, tempstr);
469     IF (clip_right > 0) THEN
470       clip_string (len - clip_right, clip_right, tempstr);
471     IF (new_tval <> 0) THEN BEGIN
472       concat_str (tempstr, 'OR');
473       integer_string (-new_tval, 5, ADDR(tempstr));
474       concat_str (tempstr, ',0;');
475     END;
476     IF (rel_span <> 1.0L0) THEN
477       concat_str (tempstr, 'DX1;');
478     acquire_display;
479     send_scale (status_path, new_tval, new_uval, vval, uval);
480     gistr := 'HF1;';
481     out_disp_string (status_path, gistr);
482     ( persistence traces )
483     IF (active_trace = 0)
484     THEN FOR i := PERSIST_ITEM_OFFSET TO PERSIST_ITEM_OFFSET+MAX_PERSIST_T
485     DO BEGIN
486       group_item_string (persist_group, i, gistr);
487       out_disp_string (status_path, gistr);
488       out_disp_string (status_path, tempstr);
489     END;
490     ( normal trace: must be done AFTER the persistence traces in order for
491       update blankahead to work (it depends upon the prior item and group)
492     group_item_string (trace_group, active_trace + 1, gistr);
493     out_disp_string (status_path, gistr);
494     concat_str (tempstr, 'HF0;');
495     out_disp_string (status_path, tempstr);
496     release_display;
497     update_blankahead;              ( does acquire/release_display )
498   END;
499
500   PROCEDURE init_some_interp;
```

```
Apr 25 17:20 1989  exec_freq.P Page 11

501  BEGIN
502    the_trace    := get_trace_addr (active_trace);
503    buckets      := state.num_buckets;            ( get from trace? )
504    scaled_buckets := (buckets - 1) * one;
505    interp_dest  := 0;
506    interp_source := longinteger (last_rel_start * buckets * longreal (on
507    interp_inc   := longinteger (last_rel_span * longreal (one));
508    part         := 1;
509  END;
510
511  PROCEDURE do_some_interp;
512  VAR
513    stop_dest, n : integer;
514    out_this     : longinteger;
515    f1, f2       : longinteger;
516  BEGIN
517    $ OPTIMIZE OFF $
518    CASE part OF
519    1: BEGIN
520         stop_dest := interp_dest + 100;      ( how much to do )
521         IF (stop_dest >= buckets - 1) THEN BEGIN
522            stop_dest := buckets - 1;
523            part := PARTS_DONE;
524         END;
525         REPEAT
526            interp_point;                     ( in execa.S,uses interp
527         UNTIL (interp_dest > stop_dest);
528       END;
529    PARTS_DONE: ;
530    END;
531    $ OPTIMIZE ON $
532  END;
533
534  PROCEDURE restore_orig_trace (cmd: pdc_type);
535  VAR
536    tempstr: PACKED ARRAY [0..25] OF CHAR;
537    grpstr : PACKED ARRAY [0..17] OF CHAR;
538    send_new : boolean;
539    i        : BYTE;
540    (use_holdoff : boolean;)
541  BEGIN
542    IF cmd <> cmd_cf THEN BEGIN
543      WHILE part <> PARTS_DONE DO do_some_interp;  ( wait for new trace res
544      move_block (ADDR(rpg_trace), ptr_integer(the_trace), buckets*2);
545      acquire_display;
546      erase_all_persist(TRUE);                    ( scaled persistence traces look
547      update_dscale_nocalc;
548      group_item_string (trace_group, active_trace + 1, grpstr);
549      (use_holdoff := gem_version >= GEM_CAN_HOLDOFF;)
550      tempstr := 'HF';';
```

```
Apr 25 17:20 1989  exec_freq.P Page 12

551      out_disp_string (status_path, tempstr);
552      tempstr := 'OR0,0;DX1;';
553      out_disp_string (status_path, grpstr);
554      out_disp_string (status_path, tempstr);
555      IF (active_trace = 0) THEN
556      FOR i := PERSIST_ITEM_OFFSET TO PERSIST_ITEM_OFFSET + MAX_PERSIST_TR
557      DO BEGIN
558         group_item_string (persist_group, i, grpstr);
559         out_disp_string (status_path, grpstr);
560         out_disp_string (status_path, tempstr);
561      END;
562      release_display;
563      IF (NOT state.want_persist) THEN    ( scaled persistence traces look
564         display_trace (active_trace);    ( show trace )
565      (IF use_holdoff THEN)
566         tempstr := 'HF0;';
567      acquire_display;
568      out_disp_string (status_path, tempstr);
569      release_display;
570    END;
571  END;
572
573  (***********************************************************************
574   FOR CENTER, START, AND STOP FREQUENCY GIVEN THE RPG COUNT, CALCULATE
575   THE NEW ACTIVE VALUE, DISPLAY IT, AND UPDATE THE GRAPHICAL DISPLAY.
576  ***********************************************************************)
577
578  PROCEDURE freq_adjust_kbd_screen (cmd: pdc_type; rpg: integer);
579  VAR
580    last_freq    : longreal;
581
582  BEGIN
583    IF rpg <> 0 THEN  BEGIN
584
585      (*** GIVEN RPG COUNTS, CALCULATE NEW FREQUENCY AND DISPLAY IT ***)
586      last_freq := kbd_frequency;
587      IF cmd = cmd_sp THEN
588         rpg_step_log (kbd_frequency, rpg_log_steps[logstep_1251, rpg)
589      ELSE
590         rpg_step_linear (kbd_frequency, state.span * 0.1[0, rpg);
591      data_invalid;
592      (this is for rpg, don't put in display process)
593      display_active_value(2, kbd_frequency, hz_unit,
594                           freq_resolution( dev_crt )) {
595
596      (*** PERFORM THE DESIRED GRAPHICAL UPDATE FOR THE GIVEN COMMAND ***)
597
598      IF cmd = cmd_cf THEN BEGIN
599         freeze_trace;
600
```

We claim:

1. In an electronic test instrument having a digital display circuit including a CRT for displaying signal waveforms representing characteristics of an AC signal, method comprising the steps of:
   a) defining a plurality, N, of traces of the signal to be displayed;
   b) assigning coordinate values to points along each trace, each coordinate value corresponding to a pixel location on the CRT; and,
   c) plotting and simultaneously displaying each of the N traces by illuminating the pixel locations indicated by the assigned coordinate values.

2. Method according to claim 1 wherein the traces of the signal are sequentially received, further comprising the steps of:
   d) eliminating an oldest one of the N sequentially received traces of the signal when a subsequent trace of the signal is received;
   e) including the subsequent trace of the signal as a newest one of the N traces; and,
   f) continuing to display the previous N-1 traces of the signal while updating the display with the newest one of the N traces.

3. Method according to claim 1 wherein the illuminated pixel locations are unconnected and the traces appear as a plurality of unconnected dots on the CRT.

4. Method according to claim 1 wherein the illuminated pixels are connected and the traces appear as a plurality of lines on the CRT.

5. Method according to claim 1 further comprising the steps of:
   d) providing a color graphics controller/color CRT in the display circuit;
   e) determining, for each coordinate value assigned, the number of traces having a corresponding coordinate value, the number of traces determined to have a corresponding coordinate value being a count of the number of times that the corresponding pixel location will be overlapped by the N traces;
   f) assigning a gray scale level to each coordinate value based upon the count determined in step (e); and,
   g) illuminating the pixel locations at an intensity determined by the gray scale levels assigned in step (f).

6. Method according to claim 5 further comprising the steps of:
   h) eliminating an oldest one of the N sequentially received traces of the signal when a subsequent trace of the signal is received;
   i) including the subsequent trace of the signal as a newest one of the N traces; and,
   j) continuing to display the previous N−1 traces of the signal while updating the display with the newest one of the N traces.

7. Method according to claim 1 wherein the electronic test instrument is a digital display spectrum analyzer.

8. Method of simulating an analog display in a digital display comprising the steps of:
   a) defining a plurality, N, of traces of the signal to be displayed on a CRT;
   b) assigning coordinate values to points along each trace, each coordinate value corresponding to a pixel location on the CRT;
   c) plotting and simultaneously displaying each of the N traces by illuminating the pixel locations indicated by the assigned coordinate values, the display of the N traces being in one of the following modes:
      (i) a dots mode wherein illuminated pixel locations are unconnected and the traces appear as a plurality of unconnected dots on the CRT;
      (ii) a lines mode wherein the illuminated pixels are connected and the traces appear as a plurality of lines on the CRT;
   d) eliminating an oldest one of the N sequentially received traces of the signal when a subsequent trace of the signal is received;
   e) including the subsequent trace of the signal as a newest one of the N traces; and,
   f) continuing to display the previous N-1 traces of the signal while updating the display with the newest one of the N traces.

9. Method according to claim 8 wherein the CRT is monochromatic.

10. Method according to claim 8 further comprising the steps of:
    g) providing a color graphics controller/color CRT;
    h) determining, for each coordinate value assigned, the number of traces having a corresponding coordinate value, the number of traces determined to have a corresponding coordinate value being a count of the number of times that the corresponding pixel location will be overlapped by the N traces;
    i) assigning a gray scale level to each coordinate value based upon the count determined in step (h); and,
    j) illuminating the pixel locations at an intensity determined by the gray scale levels assigned in step (i).

11. Method for simulating persistence and providing multiple traces and intensity variations in the display of a signal waveform provided in a digital display comprising the steps of:
    a) providing a color graphics controller/color CRT;
    b) defining a plurality, N, of traces of the signal to be displayed on the color CRT;
    c) assigning coordinate values to points along each trace, each coordinate value corresponding to a pixel location on the CRT;
    d) determining, for each coordinate value assigned, the number of traces having a corresponding coordinate value, the number of traces determined to have a corresponding coordinate value being a count of the number of times that the corresponding pixel location will be overlapped by the N traces;
    e) assigning a gray scale level to each coordinate value based upon the count determined in step (d);
    f) plotting and simultaneously displaying each of the N traces by illuminating the pixel locations indicated by the assigned coordinate values at an intensity determined by the gray scale levels assigned in step (e);
    g) eliminating an oldest one of the N sequentially received traces of the signal when a subsequent trace of the signal is received;
    h) including the subsequent trace of the signal as a newest one of the N traces; and,
    i) continuing to display the previous N−1 traces of the signal while updating the display with the newest one of the N traces.

12. Digital display apparatus comprising:
a) a color graphics controller/color CRT for displaying signal waveforms; and,
b) means for plotting and simultaneously displaying a plurality, T, of traces of a signal waveform to be displayed, for determining and assigning gray level intensities to pixel locations of the CRT based upon the number of the N traces passing through each pixel location, and illuminating each pixel location at its assigned gray level intensity;
whereby different pixels of the CRT may be illuminated at different intensity values to reflect a characteristic of the signal, and trace persistence may be simulated as a consequence of simultaneously displaying a plurality of traces of the signal, thereby simulating an analog display.

13. Apparatus according to claim 12 further comprising a local oscillator module including a controller having a main processor and ROM for controlling the digital display, and the recited means comprises firmware stored in the ROM.

14. Apparatus according to claim 13 wherein the digital display is incorporated into a spectrum analyzer and the spectrum analyzer comprises a Hewlett-Packard Company model 71000A digital display spectrum analyzer and the local oscillator comprises a Hewlett-Packard Company model 70900A local oscillator module.

15. Apparatus according to claim 13 wherein the firmware directs the controller to display the N traces in one of the following modes:
(a) a dots mode wherein illuminated pixel locations are unconnected and the traces appear as a plurality of unconnected dots on the CRT;
(b) a lines mode wherein the illuminated pixels are connected and the traces appear as a plurality of lines on the CRT.

16. Apparatus according to claim 13 wherein the firmware directs the controller to perform the following steps:
a) eliminating an oldest one of the N sequentially received traces of the signal when a subsequent trace of the signal is received;
b) including the subsequent trace of the signal as a newest one of the N traces; and,
c) continuing to display the previous N-1 traces of the signal while updating the display with the newest one of the N traces.

17. Apparatus according to claim 13 wherein the firmware directs the controller to perform the following steps:
a) assign coordinate values to points along each trace, each coordinate value corresponding to a pixel location on the CRT;
b) determine, for each coordinate value assigned, the number of traces having a corresponding coordinate value, the number of traces determined to have a corresponding coordinate value being a count of the number of times that the corresponding pixel location will be overlapped by the N traces;
c) assign a gray scale level to each coordinate value based upon the count determined in immediately preceding step (b); and,
d) illuminate the pixel locations at an intensity determined by the gray scales assigned in step (c).

* * * * *